US009761413B2

(12) United States Patent
Foret

(10) Patent No.: US 9,761,413 B2
(45) Date of Patent: *Sep. 12, 2017

(54) HIGH TEMPERATURE ELECTROLYSIS GLOW DISCHARGE DEVICE

(71) Applicant: Foret Plasma Labs, LLC, The Woodlands, TX (US)

(72) Inventor: Todd Foret, The Woodlands, TX (US)

(73) Assignee: Foret Plasma Labs, LLC, The Woodlands, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/214,473

(22) Filed: Mar. 14, 2014

(65) Prior Publication Data
US 2014/0212116 A1 Jul. 31, 2014

Related U.S. Application Data

(63) Continuation-in-part of application No. 13/586,449, filed on Aug. 15, 2012, now Pat. No. 9,111,712.
(Continued)

(51) Int. Cl.
*H01J 5/10* (2006.01)
*H01J 17/26* (2012.01)
*H01J 37/32* (2006.01)
*F22B 1/28* (2006.01)
*H05H 1/42* (2006.01)
(Continued)

(52) U.S. Cl.
CPC ........ *H01J 37/32027* (2013.01); *F22B 1/281* (2013.01); *H01J 37/32018* (2013.01);
(Continued)

(58) Field of Classification Search
None
See application file for complete search history.

(56) References Cited

U.S. PATENT DOCUMENTS 481,979 A 9/1892 Stanley
501,732 A 7/1893 Roeske
(Continued)

FOREIGN PATENT DOCUMENTS

JP 2006-501980 A 1/2006
KR 101999009569 A 2/1999
(Continued)

OTHER PUBLICATIONS

Belani, A., "It's Time for an Industry Initiative on Heavy Oil," JPT Online accessed on Oct. 16, 2007 at http://www.spe.org/spe-app/spe/jpt/2006/06/mangement_heavy_oil.htm.
(Continued)

*Primary Examiner* — Ashok Patel
(74) *Attorney, Agent, or Firm* — Daniel J. Chalker; Edwin S. Flores; Chalker Flores, LLP

(57) ABSTRACT

The present invention provides a glow discharge assembly that includes an electrically conductive cylindrical screen, a flange assembly, an electrode, an insulator and a non-conductive granular material. The electrically conductive cylindrical screen has an open end and a closed end. The flange assembly is attached to and electrically connected to the open end of the electrically conductive cylindrical screen. The flange assembly has a hole with a first diameter aligned with a longitudinal axis of the electrically conductive cylindrical screen. The electrode is aligned with the longitudinal axis of the electrically conductive cylindrical screen and extends through the hole of the flange assembly into the electrically conductive cylindrical screen. The insulator seals the hole of the flange assembly around the electrode and maintains a substantially equidistant gap between the electrically conductive cylindrical screen and the electrode. The non-conductive granular material is disposed within the substantially equidistant gap.

31 Claims, 14 Drawing Sheets

Related U.S. Application Data which is a continuation of application No. 12/374,575, filed on Sep. 24, 2009, now Pat. No. 8,230,738, which is a continuation-in-part of application No. 12/288,170, filed on Oct. 16, 2008, now Pat. No. 9,051,820, said application No. 12/371,575 is a continuation-in-part of application No. 12/370,591, filed on Feb. 12, 2009, now Pat. No. 8,074,439.

(60) Provisional application No. 61/784,794, filed on Mar. 14, 2013, provisional application No. 61/803,992, filed on Mar. 21, 2013, provisional application No. 60/980,443, filed on Oct. 16, 2007, provisional application No. 61/027,879, filed on Feb. 12, 2008.

(51) Int. Cl.
  H05H 1/48 (2006.01)
  H05H 1/34 (2006.01)

(52) U.S. Cl.
  CPC ............ *H05H 1/3405* (2013.01); *H05H 1/42* (2013.01); *H05H 1/48* (2013.01); *H05H 2001/3489* (2013.01)

(56) References Cited

U.S. PATENT DOCUMENTS

| | | |
|---|---|---|
| 2,784,294 A | 3/1957 | Gravert |
| 2,898,441 A | 8/1959 | Reed et al. |
| 2,923,809 A | 2/1960 | Clews et al. |
| 3,004,189 A | 10/1961 | Giannini |
| 3,082,314 A | 3/1963 | Arata et al. |
| 3,131,288 A | 4/1964 | Browning et al. |
| 3,242,305 A | 3/1966 | Kane et al. |
| 3,534,388 A | 10/1970 | Ito et al. |
| 3,567,898 A | 3/1971 | Fein |
| 3,619,549 A | 11/1971 | Hogan et al. |
| 3,641,308 A | 2/1972 | Couch, Jr. et al. |
| 3,787,247 A | 1/1974 | Couch, Jr. |
| 3,798,784 A | 3/1974 | Kovats et al. |
| 3,830,428 A | 8/1974 | Dyos |
| 3,833,787 A | 9/1974 | Couch, Jr. |
| 4,067,390 A | 1/1978 | Camacho et al. |
| 4,169,503 A | 10/1979 | Scott |
| 4,203,022 A | 5/1980 | Couch, Jr. et al. |
| 4,265,747 A | 5/1981 | Copa et al. |
| 4,311,897 A | 1/1982 | Yerushalmy |
| 4,344,839 A | 8/1982 | Pachkowski et al. |
| 4,463,245 A | 7/1984 | McNeil |
| 4,531,043 A | 7/1985 | Zverina et al. |
| 4,567,346 A | 1/1986 | Marhic |
| 4,624,765 A | 11/1986 | Cerkanowicz et al. |
| 4,685,963 A | 8/1987 | Saville et al. |
| 4,776,638 A | 10/1988 | Hahn |
| 4,791,268 A | 12/1988 | Sanders et al. |
| 4,886,118 A | 12/1989 | Van Meurs et al. |
| 5,019,268 A | 5/1991 | Rogalla |
| 5,048,404 A | 9/1991 | Bushnell et al. |
| 5,082,054 A | 1/1992 | Kiamanesh |
| 5,132,512 A * | 7/1992 | Sanders ............... B23K 10/006 219/121.48 |
| 5,166,950 A | 11/1992 | Jouvaud et al. |
| 5,326,530 A | 7/1994 | Bridges |
| 5,348,629 A | 9/1994 | Khudenko |
| 5,368,724 A | 11/1994 | Ayres et al. |
| 5,534,232 A | 7/1996 | Denes et al. |
| 5,609,736 A | 3/1997 | Yamamoto |
| 5,609,777 A | 3/1997 | Apunevich et al. |
| 5,655,210 A | 8/1997 | Gregoire et al. |
| 5,660,743 A | 8/1997 | Nemchinsky |
| 5,738,170 A | 4/1998 | Lavernhe |
| 5,746,984 A | 5/1998 | Hoard |
| 5,760,363 A | 6/1998 | Hackett et al. |
| 5,766,447 A | 6/1998 | Creijghton |
| 5,876,663 A | 3/1999 | Laroussi |
| 5,879,555 A | 3/1999 | Khudenko |
| 5,893,979 A | 4/1999 | Held |
| 5,908,539 A | 6/1999 | Young et al. |
| 5,979,551 A | 11/1999 | Uban et al. |
| 6,007,681 A | 12/1999 | Kawamura et al. |
| 6,117,401 A | 9/2000 | Juvan |
| 6,228,266 B1 | 5/2001 | Shim |
| 6,514,469 B1 | 2/2003 | Kado et al. |
| 6,749,759 B2 | 6/2004 | Denes et al. |
| 6,929,067 B2 | 8/2005 | Vinegar et al. |
| 6,942,786 B1 | 9/2005 | Fosseng |
| 6,987,792 B2 | 1/2006 | Do et al. |
| 7,081,171 B1 | 7/2006 | Sabol et al. |
| 7,086,468 B2 | 8/2006 | De Rouffignac et al. |
| 7,096,953 B2 | 8/2006 | De Rouffignac et al. |
| 7,121,342 B2 | 10/2006 | Vinegar et al. |
| 7,128,816 B2 | 10/2006 | Denes et al. |
| 7,422,695 B2 * | 9/2008 | Foret .................. C02F 1/36 210/748.01 |
| 7,536,975 B2 | 5/2009 | Denes et al. |
| 7,857,972 B2 * | 12/2010 | Foret .................. A23B 4/015 210/243 |
| 7,893,408 B2 | 2/2011 | Hieftje et al. |
| 8,074,439 B2 | 12/2011 | Foret |
| 8,278,810 B2 * | 10/2012 | Foret .................. H05H 1/24 313/231.01 |
| 8,568,663 B2 * | 10/2013 | Foret .................. H05H 1/24 204/164 |
| 8,810,122 B2 * | 8/2014 | Foret .................. B23K 10/00 313/231.41 |
| 8,833,054 B2 * | 9/2014 | Foret .................. F02C 3/14 60/202 |
| 8,904,749 B2 * | 12/2014 | Foret .................. F02C 3/14 60/202 |
| 9,051,820 B2 | 6/2015 | Foret |
| 2002/0148562 A1 | 10/2002 | Aoyagi et al. |
| 2003/0024806 A1 | 2/2003 | Foret |
| 2003/0101936 A1 | 6/2003 | Lee |
| 2003/0150325 A1 | 8/2003 | Hyppanen |
| 2003/0179536 A1 | 9/2003 | Stevenson et al. |
| 2003/0213604 A1 | 11/2003 | Stevenson et al. |
| 2005/0087435 A1 | 4/2005 | Kong et al. |
| 2005/0151455 A1 | 7/2005 | Sato et al. |
| 2005/0155373 A1 | 7/2005 | Hirooka et al. |
| 2006/0104849 A1 | 5/2006 | Tada et al. |
| 2006/0151445 A1 | 7/2006 | Schneider |
| 2006/0196424 A1 | 9/2006 | Swallow et al. |
| 2007/0104610 A1 | 5/2007 | Houston et al. |
| 2007/0240975 A1 | 10/2007 | Foret |
| 2007/0253874 A1 | 11/2007 | Foret |
| 2008/0058228 A1 | 3/2008 | Wilson |
| 2008/0202915 A1 | 8/2008 | Hieftje et al. |
| 2009/0118145 A1 | 5/2009 | Wilson et al. |
| 2009/0200032 A1 | 8/2009 | Foret |
| 2009/0235637 A1 | 9/2009 | Foret |
| 2009/0277774 A1 | 11/2009 | Foret |
| 2010/0212498 A1 | 8/2010 | Salazar |
| 2011/0005999 A1 | 1/2011 | Randal |
| 2011/0022043 A1 * | 1/2011 | Wandke ............... A61N 1/40 606/41 |
| 2011/0031224 A1 | 2/2011 | Severance, Jr. et al. |
| 2011/0225948 A1 | 9/2011 | Valeev et al. |
| 2012/0097648 A1 | 4/2012 | Foret |
| 2012/0227968 A1 | 9/2012 | Eldred et al. |
| 2013/0020926 A1 | 1/2013 | Foret |

FOREIGN PATENT DOCUMENTS

| | | |
|---|---|---|
| KR | 10-2004-000510 A | 1/2004 |
| WO | 2007117634 A2 | 10/2007 |

OTHER PUBLICATIONS

Brandt, A. R., "Converting Green River oil shale to liquid fuels with the Shell in-situ conversion process: energy inputs and greenhouse gas emissions," Jun. 30, 2007.

(56) References Cited

OTHER PUBLICATIONS

Kavan, L., "Electrochemical Carbon," Chem Rev (1997), 97:3061-3082.
Understanding in-situ combustion, www.HeavyOilinfo.com, accessed Oct. 16, 2007.
Unleashing the potential: Heavy Oil, Supplement to E&P Annual Reference Guide, www.eandp.info.com, Jun. 2007.
International Search Report [KIPO] PCT/US201/062941 dated Jan. 27, 2014.
International Search Report and Written Opinion for PCT/US2008/011926 dated Apr. 27, 2009.
International Search Report and Written Opinion for PCT/US2009/000937 dated Sep. 17, 2009.
"Brandt, A. R., ""Converting Green River oil shale to liquid fuels with Alberta Taciuk Processor: energy inputs andgreenhouse gas emissions,""" Jun. 1, 2007".
PCT/US2014/030090 [KIPO] International Search Report dated Sep. 25, 2014.
PCT/US2014/2014/024991 [KIPO] International Search Report dated Aug. 6, 2014.

\* cited by examiner

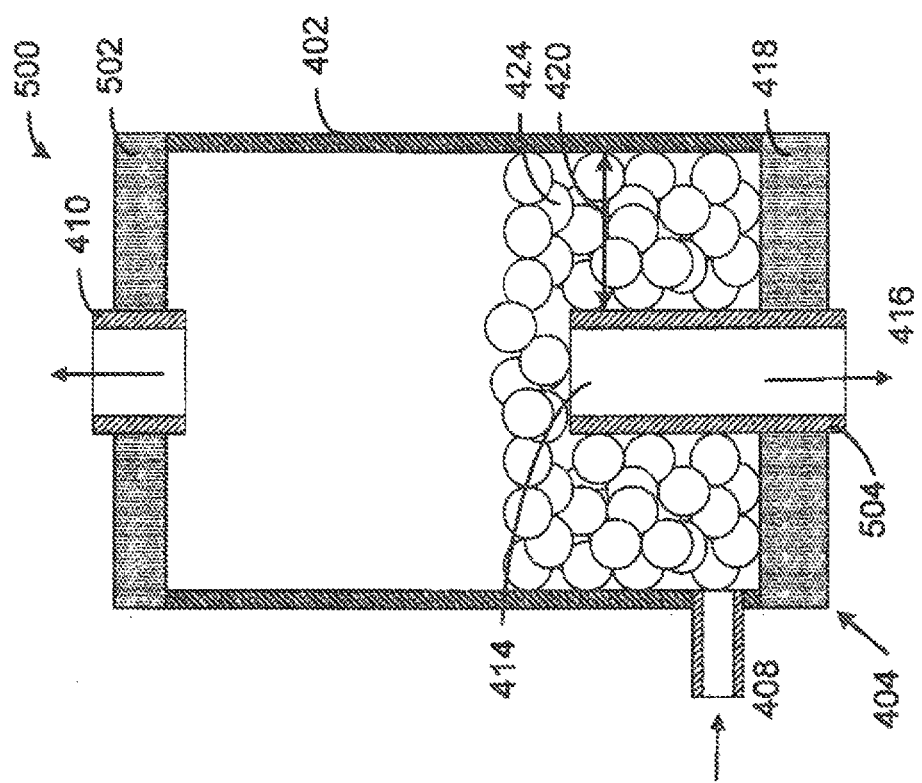
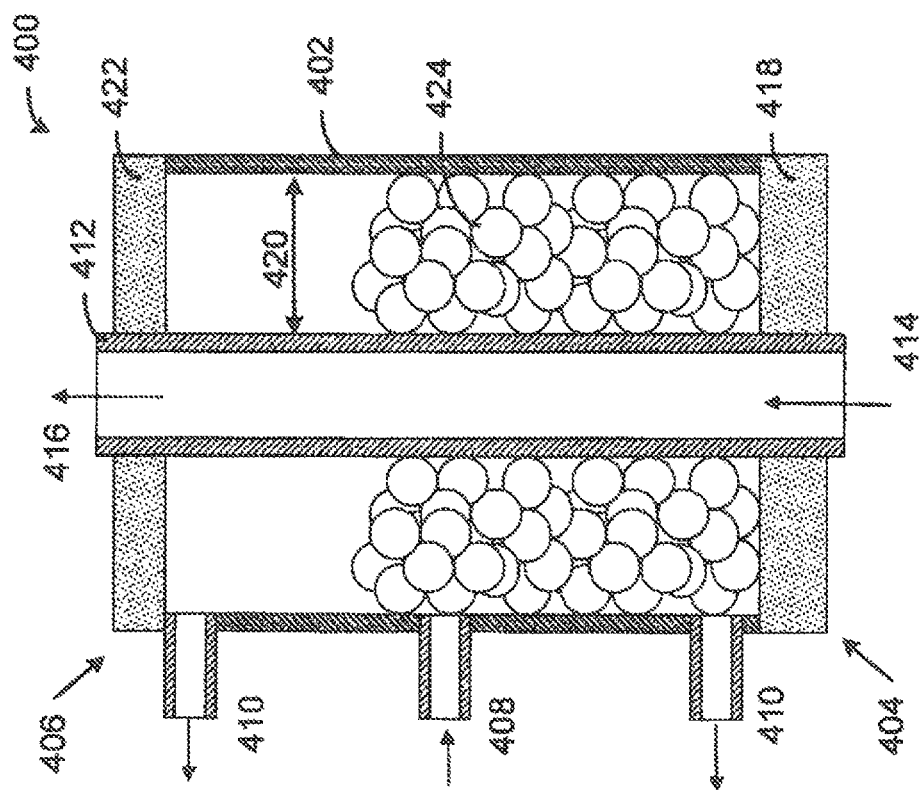

Fig. 10 - Tailings Pond Water Results

FILTRATE:

| | Sample | Date | pH | SG | Cr | %N | ppm F | %Fe2O3 | %SO4 | ppm NH3 | %P2O5 | %Si | %MgO | %Al2O3 | %CaO | %Na | %K | As | Cr | Co | Cu | Mo | Ni |
|---|---|---|---|---|---|---|---|---|---|---|---|---|---|---|---|---|---|---|---|---|---|---|---|
| A | Tailings Pond Water | 30-Oct | 1.4 | 1.3465 | 4.0 | 0.14 | 7,921 | 0.01 | 0.40 | 1,310 | 2.17 | 0.06 | 0.04 | 0.01 | 0.25 | 0.28 | 0.03 | 7.0 | 0.7 | 0.0 | 3.5 | 1.0 | 3.0 |
| 1 | Hi Teemper | 6-Nov | 2.3 | 1.0300 | 0.0 | 0.01 | 103 | 0.05 | 0.01 | 497 | 0.00 | 0.01 | 0.02 | 0.00 | 0.06 | 0.05 | 0.01 | 2.3 | 0.0 | 0.0 | 1.5 | 0.0 | 0.0 |
| 2 | Hi Teemper Arc Whirl Arc Whirl, plasma on | 6-Nov | 1.7 | 1.0300 | 18.3 | 0.01 | 3,480 | 0.02 | 0.24 | 708 | 0.69 | 0.03 | 0.02 | 0.01 | 0.17 | 0.14 | 0.02 | 5.5 | 0.0 | 0.0 | 7.9 | 0.2 | 14.0 |
| 3 | Hi Teemper Air Arc Whirl | 6-Nov | 1.5 | 1.0400 | 71.4 | 0.18 | 8,570 | 0.06 | 0.52 | 1,630 | 2.30 | 0.04 | 0.05 | 0.01 | 0.35 | 0.26 | 0.03 | 7.3 | 0.3 | 0.0 | 15.7 | 0.6 | 42.8 |
| 4 | Bottoms Off reactor | 6-Nov | 1.2 | 1.1500 | 667.3 | 0.15 | 14,400 | 0.76 | 1.39 | 4,340 | 8.72 | 0.03 | 0.16 | 0.02 | 0.66 | 0.24 | 0.04 | 12.4 | 4.1 | 4.0 | 15.3 | 7.0 | 356.7 |
| 5 | Bomb Gas, Arc on, plasma off | 6-Nov | | | | | | | | | | | insufficient sample recovered for analysis. | | | | | | | | | | |

Cycles of concentration (COC Ser 1)

| | | | | | | | | | | | | | | | | | | | | | | |
|---|---|---|---|---|---|---|---|---|---|---|---|---|---|---|---|---|---|---|---|---|---|---|
| | | | | 167 | 1 | 2 | 51 | 3 | 3 | 4 | 1 | 4 | 2 | 3 | 1 | 1 | 2 | 6 | 400 | 4 | 7 | 120 |
| | | | | 55 | 2 | 0 | 18 | 2 | 2 | 1 | 0 | 3 | 0 | 2 | 1 | 1 | 1 | 2 | 30 | 2 | 3 | 84 |

SOLIDS (Retained on Whatmans 240 filter paper):

| | Sample | Date | gm, dry | %P2O5 | %SO4 | %MgO | %Al2O3 | %Fe2O3 | %CaO | %Mn | %K | %Si | ppm N |
|---|---|---|---|---|---|---|---|---|---|---|---|---|---|
| A | Tailings | 30-Oct | | 3.30 | 3.35 | 0.06 | 0.45 | 0.09 | 3.56 | 0.44 | 0.05 | 0.08 | 14 |
| 1 | Hi Teemper | 6-Nov | 2.7 | 0.0 | 0.2 | 0.02 | 0.02 | 1.08 | 0.2 | 0.22 | 0.02 | 0.02 | 0.0 |
| 2 | Hi Teemper Arc Whirl Arc Whirl, plasma on | 6-Nov | 2.7 | 1.6 | 0.5 | 0.04 | 0.02 | 0.30 | 0.4 | 0.31 | 0.03 | 0.03 | 0.0 |
| 3 | Hi Teemper Air Arc Whirl | 6-Nov | 4.0 | 2.5 | 0.7 | 0.04 | 0.10 | 0.83 | 1.0 | 0.22 | 0.04 | 0.04 | 0.0 |
| 4 | Bottoms Off reactor | 6-Nov | 29.1 | 1.8 | 13.6 | 0.03 | 0.25 | 0.35 | 5.7 | 13.57 | 2.76 | 0.85 | 0.0 |
| 5 | Bomb Gas, Arc on, plasma off | 6-Nov | | | | | insufficient sample recovered for analysis. | | | | | | |

FIG 10 (Continued)

| Pb | Se | Mn | U | V | Zn | Ti | Appearance: |
|---|---|---|---|---|---|---|---|
| 0.0 | 3.0 | 12.0 | 14.0 | 7.4 | 20.2 | 1.7 | Colorless, slightly cloudy Settlable fines |
| 0.0 | 3.4 | 0.0 | 0.0 | 0.0 | 1.6 | 0.0 | Clear, yellowish or brownish |
| 0.0 | 2.7 | 4.2 | 2.2 | 1.3 | 13.4 | 0.0 | Clear, yellowish or brownish |
| 0.0 | 2.0 | 18.6 | 12.0 | 5.4 | 49.6 | 13.7 | Very light green |
| 0.0 | 1.3 | 112.7 | 41.1 | 26.4 | 354.4 | 7.7 | Dark green, with sediment |
|  |  |  |  |  |  |  |  |

0 0 9 3 4 18 5
0 0 7 1 2 24 0

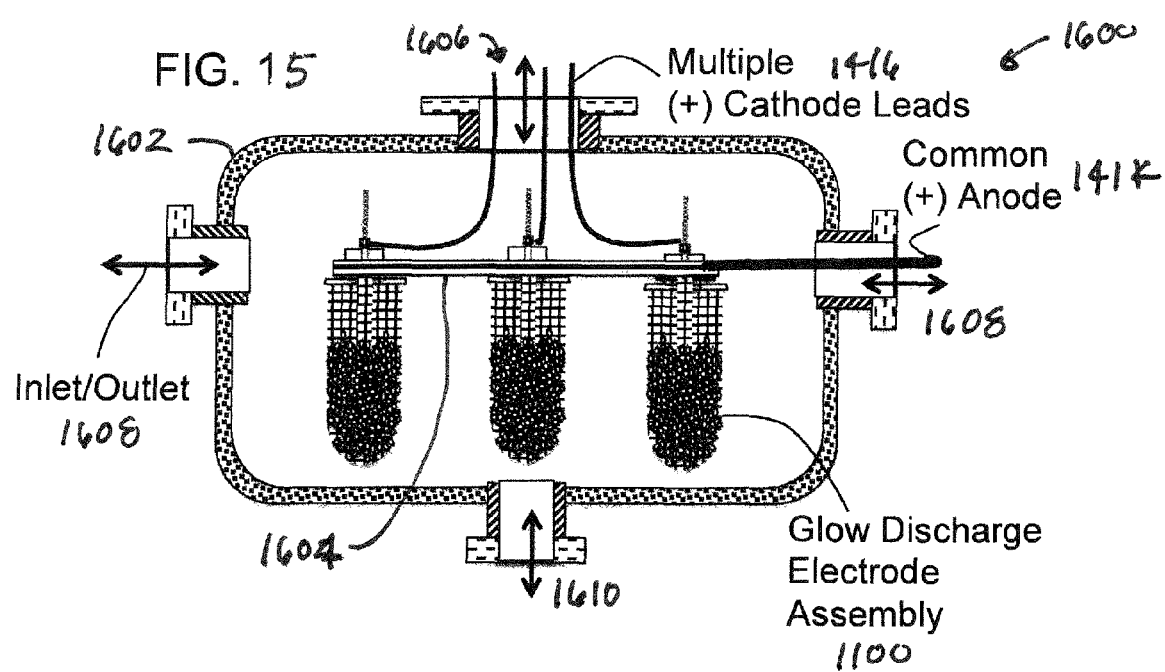

HIGH TEMPERATURE ELECTROLYSIS GLOW DISCHARGE DEVICE

PRIORITY CLAIM AND CROSS-REFERENCE TO RELATED APPLICATIONS

This patent application claims priority to and is: (1) a non-provisional patent application of U.S. Provisional Patent Application Ser. No. 61/784,794 filed on Mar. 14, 2013; (2) a non-provisional patent application of U.S. Provisional Patent Application Ser. No. 61/803,992 filed on Mar. 21, 2013; and (3) a continuation-in-part of U.S. patent application Ser. No. 13/586,449 filed on Aug. 15, 2012, now U.S. Pat. No. 9,111,712, which is a continuation application of U.S. patent application Ser. No. 12/371,575 filed on Feb. 13, 2009, now U.S. Pat. No. 8,278,810, which is: (a) a continuation-in-part application of U.S. patent application Ser. No. 12/288,170 filed on Oct. 16, 2008, now U.S. Pat. No. 9,051,820, which is a non-provisional application of U.S. Provisional Patent Application Ser. No. 60/980,443 filed on Oct. 16, 2007 and U.S. Provisional Patent Application Ser. No. 61/028,386 filed on Feb. 13, 2008; (b) a continuation-in-part application of U.S. patent application Ser. No. 12/370,591 filed on Feb. 12, 2009, now U.S. Pat. No. 8,074,439, which is non-provisional patent application of U.S. Provisional Patent Application Ser. No. 61/027,879 filed on Feb. 12, 2008; and (c) a non-provisional patent application of U.S. Provisional Patent Application Ser. No. 61/028,386 filed on Feb. 13, 2008.

The entire contents of the foregoing applications are hereby incorporated herein by reference. This application is also related to U.S. Pat. No. 7,422,695 and U.S. Pat. No. 7,857,972 and multiple patents and patent application that claim priority thereto.

FIELD OF THE INVENTION

The present invention relates generally to solid oxide electrolysis cells and plasma torches. More specifically, the present invention relates to a high temperature electrolysis glow discharge cell.

BACKGROUND OF THE INVENTION

Glow discharge and plasma systems are becoming every more present with the emphasis on renewable fuels, pollution prevention, clean water and more efficient processing methods. Glow discharge is also referred to as electroplasma, plasma electrolysis and high temperature electrolysis. In liquid glow discharge systems a plasma sheath is formed around the cathode located within an electrolysis cell.

U.S. Pat. No. 6,228,266 discloses a water treatment apparatus using a plasma reactor and a method of water treatment. The apparatus includes a housing having a polluted water inlet and a polluted water outlet; a plurality of beads (e.g., nylon and other plastic type beads) filled into the interior of the housing; a pair of electrodes, one of the electrodes contacting with the bottom of the housing, another of the electrodes contacting an upper portion of the uppermost beads; and a pulse generator connected with the electrodes by a power cable for generating pulses. Some drawbacks of the '266 plasma reactor are the requirements of an extremely high voltage pulse generator (30 KW to 150 KW), a plurality of various beads in a web shape and operating the reactor full from top to bottom. Likewise, the plasma reactor is not designed for separating a gas from the bulk liquid, nor can it recover heat or generate hydrogen. In fact, the addition of air to the plasma reactor completely defeats the sole purpose of current research for generating hydrogen via electrolysis or plasma or a combination of both. If any hydrogen is generated within the plasma reactor, the addition of air will cause the hydrogen to react with oxygen and form water. Also, there is no mention of any means for generating heat by cooling the cathode. Likewise, there is no mention of cooking organics unto the beads, nor the ability to reboil and concentrate liquids (e.g., spent acids, black liquor, etc.), nor recovering caustic and sulfides from black liquor.

The following is a list of prior art similar to the '266 patent:

| U.S. Pat. No. | Title |
| --- | --- |
| 481,979 | Apparatus for electrically purifying water |
| 501,732 | Method of an apparatus for purifying water |
| 3,798,784 | Process and apparatus for the treatment of moist materials |
| 4,265,747 | Disinfection and purification of fluids using focused laser radiation |
| 4,624,765 | Separation of dispersed liquid phase from continuous fluid phase |
| 5,019,268 | Method and apparatus for purifying waste water |
| 5,048,404 | High pulsed voltage systems for extending the shelf life of pumpable food products |
| 5,326,530 | High pulsed voltage systems for extending the shelf life of pumpable food products |
| 5,348,629 | Method and apparatus for electrolytic processing of materials |
| 5,368,724 | Apparatus for treating a confined liquid by means of a pulse electrical discharge |
| 5,655,210 | Corona source for producing corona discharge and fluid waste treatment with corona discharge |
| 5,746,984 | Exhaust system with emissions storage device and plasma reactor |
| 5,879,555 | Electrochemical treatment of materials |
| 6,007,681 | Apparatus and method for treating exhaust gas and pulse generator used therefor |

Plasma arc torches are commonly used by fabricators, machine shops, welders and semi-conductor plants for cutting, gouging, welding, plasma spraying coatings and manufacturing wafers. The plasma torch is operated in one of two modes—transferred arc or non-transferred arc. The most common torch found in many welding shops is the transferred arc plasma torch. It is operated very similar to a DC welder in that a grounding clamp is attached to a workpiece. The operator, usually a welder, depresses a trigger on the plasma torch handle which forms a pilot arc between a centrally located cathode and an anode nozzle. When the operator brings the plasma torch pilot arc close to the workpiece the arc is transferred from the anode nozzle via the electrically conductive plasma to the workpiece. Hence the name transferred arc. The non-transferred arc plasma torch retains the arc within the torch. Quite simply the arc remains attached to the anode nozzle. This requires cooling the anode. Common non-transferred arc plasma torches have a heat rejection rate of 30%. In other words, 30% of the total torch power is rejected as heat.

A major drawback in using plasma torches is the cost of inert gases such as argon and hydrogen. There have been several attempts for forming the working or plasma gas within the torch itself by using rejected heat from the electrodes to generate steam from water. The objective is to increase the total efficiency of the torch as well as reduce plasma gas cost. However, there is not a single working example that can run continuous duty. For example, the Multiplaz torch (U.S. Pat. Nos. 6,087,616 and 6,156,994) is a small hand held torch that must be manually refilled with water. The Multiplaz torch is not a continuous use plasma torch.

Other prior art plasma torches are disclosed in the following patents.

| U.S. Pat. No. | Title |
| --- | --- |
| 3,567,898 | Plasma cutting torch |
| 3,830,428 | Plasma torches |
| 4,311,897 | Plasma arc torch and nozzle assembly |
| 4,531,043 | Method of and apparatus for stabilization of low-temperature plasma of an arc burner |
| 5,609,777 | Electric-arc plasma steam torch |
| 5,660,743 | Plasma arc torch having water injection nozzle assembly |

U.S. Pat. No. 4,791,268 discloses "an arc plasma torch includes a moveable cathode and a fixed anode which are automatically separated by the buildup of gas pressure within the torch after a current flow is established between the cathode and the anode. The gas pressure draws a nontransferred pilot arc to produce a plasma jet. The torch is thus contact started, not through contact with an external workpiece, but through internal contact of the cathode and anode. Once the pilot arc is drawn, the torch may be used in the nontransferred mode, or the arc may be easily transferred to a workpiece. In a preferred embodiment, the cathode has a piston part which slidingly moves within a cylinder when sufficient gas pressure is supplied. In another embodiment, the torch is a hand-held unit and permits control of current and gas flow with a single control."

Typically, and as disclosed in the '268 patent, plasma torch gas flow is set upstream of the torch with a pressure regulator and flow regulator. In addition to transferred arc and non-transferred arc, plasma arc torches can be defined by arc starting method. The high voltage method starts by using a high voltage to jump the arc from the centered cathode electrode to the shield nozzle. The blow-back arc starting method is similar to stick welding. For example, similar to a welder touching a grounded work-pieced then pulling back the electrode to form an arc, a blow-back torch uses the cutting gas to push the negative (−) cathode electrode away from the shield nozzle. Normally, in the blow-back torch a spring or compressed gas pushes the cathode towards the nozzle so that it resets to the start mode when not in operation.

The '268 plasma torch is a blow-back type torch that uses the contact starting method. Likewise, by depressing a button and/or trigger a current is allowed to flow through the torch and thus the torch is in a dead-short mode. Immediately thereafter, gas flowing within a blow-back contact starting torch pushes upon a piston to move the cathode away from the anode thus forming an arc. Voltage is set based upon the maximum distance the cathode can be pushed back from the anode. There are no means for controlling voltage. Likewise, this type of torch can only be operated in one mode—Plasma Arc. Backflowing material through the anode nozzle is not possible in the '268 plasma torch. Moreover, there is no disclosure of coupling this torch to a solid oxide glow discharge cell.

U.S. Pat. No. 4,463,245 discloses "A plasma torch (40) comprises a handle (41) having an upper end (41B) which houses the components forming a torch body (43). Body (33) incorporates a rod electrode (10) having an end which cooperates with an annular tip electrode (13) to form a spark gap. An ionizable fuel gas is fed to the spark gap via tube (44) within the handle (41), the gas from tube (44) flowing axially along rod electrode (10) and being diverted radially through apertures (16) so as to impinge upon and act as a coolant for a thin-walled portion (14) of the annular tip electrode (13). With this arrangement the heat generated by the electrical arc in the inter-electrode gap is substantially confined to the annular tip portion (13A) of electrode (13) which is both consumable and replaceable in that portion (13A) is secured by screw threads to the adjoining portion (13B) of electrode (13) and which is integral with the thin-walled portion (14)." Once again there is no disclosure of coupling this torch to a solid oxide glow discharge cell.

The following is a list of prior art teachings with respect to starting a torch and modes of operation.

| U.S. Pat. No. | Title |
| --- | --- |
| 2,784,294 | Welding torch |
| 2,898,441 | Arc torch push starting |
| 2,923,809 | Arc cutting of metals |
| 3,004,189 | Combination automatic-starting electrical plasma torch and gas shutoff valve |
| 3,082,314 | Plasma arc torch |
| 3,131,288 | Electric arc torch |
| 3,242,305 | Plasma retract arc torch |
| 3,534,388 | Arc torch cutting process |
| 3,619,549 | Arc torch cutting process |
| 3,641,308 | Plasma arc torch having liquid laminar flow jet for arc constriction |
| 3,787,247 | Water-scrubber cutting table |
| 3,833,787 | Plasma jet cutting torch having reduced noise generating characteristics |
| 4,203,022 | Method and apparatus for positioning a plasma arc cutting torch |
| 4,463,245 | Plasma cutting and welding torches with improved nozzle electrode cooling |
| 4,567,346 | Arc-striking method for a welding or cutting torch and a torch adapted to carry out said method |

High temperature steam electrolysis and glow discharge are two technologies that are currently being viewed as the future for the hydrogen economy. Likewise, coal gasification is being viewed as the technology of choice for reducing carbon, sulfur dioxide and mercury emissions from coal burning power plants. Renewables such as wind turbines, hydroelectric and biomass are being exploited in order to reduce global warming.

Water is one of our most valuable resources. Copious amounts of water are used in industrial processes with the end result of producing wastewater. Water treatment and wastewater treatment go hand in hand with the production of energy.

Therefore, a need exists for an all electric system that can regenerate, concentrate or convert waste materials such as black liquor, spent caustic, phosphogypsum tailings water, wastewater biosolids and refinery tank bottoms to valuable feedstocks or products such as regenerated caustic soda, regeneratred sulfuric acid, concentrated phosphoric acid, syngas or hydrogen and steam. Although world-class size refineries, petrochem facilities, chemical plants, upstream heavy oil, oilsands, gas facilities and pulp and paper mills would greatly benefit from such a system, their exists a dire need for a distributed all electric mini-refinery that can treat water while also cogenerate heat and fuel.

SUMMARY OF THE INVENTION

The present invention provides an all electric system that can regenerate, concentrate or convert waste materials such as black liquor, spent caustic, phosphogypsum tailings water, wastewater biosolids and refinery tank bottoms to valuable feedstocks or products such as regenerated caustic soda, regeneratred sulfuric acid, concentrated phosphoric acid, syngas or hydrogen and steam. Although world-class size refineries, petrochem facilities, chemical plants, upstream heavy oil, oilsands, gas facilities and pulp and paper mills would greatly benefit from such a system, their exists a dire need for a distributed all electric mini-refinery that can treat water while also cogenerate heat and fuel.

The present invention provides a glow discharge electrode assembly that includes an electrically conductive cylindrical screen, a flange assembly, an electrode, an insulator and a non-conductive granular material. The electrically conductive cylindrical screen has an open end and a closed end. The flange assembly is attached to and electrically connected to the open end of the electrically conductive cylindrical screen. The flange assembly has a hole with a first diameter aligned with a longitudinal axis of the electrically conductive cylindrical screen. The electrode is aligned with the longitudinal axis of the electrically conductive cylindrical screen and extends through the hole of the flange assembly into the electrically conductive cylindrical screen. The electrode has a second diameter that is smaller than the first diameter of the hole. The insulator seals the hole of the flange assembly around the electrode and maintains a substantially equidistant gap between the electrically conductive cylindrical screen and the electrode. The non-conductive granular material is disposed within the substantially equidistant gap, wherein (a) the non-conductive granular material allows an electrically conductive fluid to flow between the electrically conductive cylindrical screen and the electrode, and (b) the combination of the non-conductive granular material and the conductive fluid prevents electrical arcing between the electrically conductive cylindrical screen and the electrode during an electric glow discharge.

In addition, the present invention provides a glow discharge vessel that includes a vessel, a top cover and a glow discharge electrode assembly. The vessel has an open top, an outlet disposed in an upper portion of the vessel, and an inlet disposed in a lower portion of the vessel. The top cover seals the open top of the vessel, secures a glow discharge electrode assembly within the vessel, and provides a first electrical connection and a second electrical connection to the glow discharge electrode assembly. The glow discharge electrode assembly includes an electrically conductive cylindrical screen, a flange assembly, an electrode, an insulator and a non-conductive granular material. The electrically conductive cylindrical screen has an open end and a closed end. The flange assembly is attached to and electrically connected to the open end of the electrically conductive cylindrical screen. The flange assembly has a hole with a first diameter aligned with a longitudinal axis of the electrically conductive cylindrical screen. The electrode is aligned with the longitudinal axis of the electrically conductive cylindrical screen and extends through the hole of the flange assembly into the electrically conductive cylindrical screen. The electrode has a second diameter that is smaller than the first diameter of the hole. The insulator seals the hole of the flange assembly around the electrode and maintains a substantially equidistant gap between the electrically conductive cylindrical screen and the electrode. The non-conductive granular material is disposed within the substantially equidistant gap, wherein (a) the non-conductive granular material allows an electrically conductive fluid to flow between the electrically conductive cylindrical screen and the electrode, and (b) the combination of the non-conductive granular material and the conductive fluid prevents electrical arcing between the electrically conductive cylindrical screen and the electrode during an electric glow discharge. The electric glow discharge is created whenever (a) the first electrical connection is connected to a DC electrical power supply such that the flange assembly and the electrically conductive cylindrical screen are an anode, (b) the second electrical connection is connected to the DC electrical power supply such that the electrode is a cathode, and (c) the electrically conductive fluid is introduced into the gap via the inlet of the vessel. The cathode heats up during the electric glow discharge.

The present invention also provides a glow discharge system that includes a vessel, one or more structural supports and two or more glow discharge assemblies. The vessel has an outlet disposed in a top of the vessel, at least one inlet/outlet disposed in a side of the vessel, and an inlet disposed in a lower portion of the vessel. The one or more structural supports are disposed within the vessel to secure the two or more glow discharge assemblies within the vessel, and provide a first electrical connection and a second electrical connection to each glow discharge electrode assembly. Each glow discharge electrode assembly includes an electrically conductive cylindrical screen, a flange assembly, an electrode, an insulator and a non-conductive granular material. The electrically conductive cylindrical screen has an open end and a closed end. The flange assembly is attached to and electrically connected to the open end of the electrically conductive cylindrical screen. The flange assembly has a hole with a first diameter aligned with a longitudinal axis of the electrically conductive cylindrical screen. The electrode is aligned with the longitudinal axis of the electrically conductive cylindrical screen and extends through the hole of the flange assembly into the electrically conductive cylindrical screen. The electrode has a second diameter that is smaller than the first diameter of the hole. The insulator seals the hole of the flange assembly around the electrode and maintains a substantially equidistant gap between the electrically conductive cylindrical screen and the electrode. The non-conductive granular material is disposed within the substantially equidistant gap, wherein (a) the non-conductive granular material allows an electrically conductive fluid to flow between the electrically conductive cylindrical screen and the electrode, and (b) the combination of the non-conductive granular material and the conductive fluid prevents electrical arcing between the electrically conductive cylindrical screen and the electrode during an electric glow discharge. The electric glow discharge is created whenever (a) the first electrical connection is connected to a DC electrical power supply such that the flange assembly and the electrically conductive cylindrical screen are an anode, (b) the second electrical connection is connected to the DC electrical power supply such that the electrode is a cathode, and (c) the electrically conductive fluid is introduced into the gap via the inlet of the vessel. The cathode heats up during the electric glow discharge.

Moreover, the present invention provides a method for producing a steam that includes the steps of providing a vessel, one or more structural supports and one or more glow discharge assemblies. The vessel has an outlet disposed in a top of the vessel, at least one inlet/outlet disposed in a side of the vessel, and an inlet disposed in a lower portion of the vessel. The one or more structural supports are disposed within the vessel to secure the two or more glow discharge assemblies within the vessel, and provide a first electrical connection and a second electrical connection to each glow discharge electrode assembly. Each glow discharge electrode assembly includes an electrically conductive cylindrical screen, a flange assembly, an electrode, an insulator and a non-conductive granular material. The electrically conductive cylindrical screen has an open end and a closed end. The flange assembly is attached to and electrically connected to the open end of the electrically conductive cylindrical screen. The flange assembly has a hole with a first diameter aligned with a longitudinal axis of the electrically conductive cylindrical screen. The electrode is aligned with the longitudinal axis of the electrically conductive cylindrical screen and extends through the hole of the flange assembly into the electrically conductive cylindrical screen. The electrode has a second diameter that is smaller than the first diameter of the hole. The insulator seals the hole of the flange assembly around the electrode and maintains a substantially equidistant gap between the electrically conductive cylindrical screen and the electrode. The non-conductive granular material is disposed within the substantially equidistant gap, wherein (a) the non-conductive granular material allows an electrically conductive fluid to flow between the electrically conductive cylindrical screen and the electrode, and (b) the combination of the non-conductive granular material and the conductive fluid prevents electrical arcing between the electrically conductive cylindrical screen and the electrode during an electric glow discharge. The electric glow discharge is created by: (1) connecting the first electrical connection to a DC electrical power supply such that the flange assembly and the electrically conductive cylindrical screen are an anode, (2) connecting the second electrical connection to the DC electrical power supply such that the electrode is a cathode, and (3) introducing the electrically conductive fluid into the gap via the inlet of the vessel. The steam is produced using heat generated from the cathode during the electric glow discharge.

The present invention is described in detail below with reference to the accompanying drawings.

BRIEF DESCRIPTION OF THE DRAWINGS

The above and further advantages of the invention may be better understood by referring to the following description in conjunction with the accompanying drawings, in which:

FIG. 4 is a cross-sectional view of a glow discharge cell in accordance with one embodiment of the present invention;

FIG. 5 is a cross-sectional view of a glow discharge cell in accordance with another embodiment of the present invention;

FIG. 10 is a table showing the results of the tailings pond water and solids analysis treated with one embodiment of the present invention;

FIG. 15 is a cross-sectional view of a glow discharge electrode system with multiple glow discharge electrode assemblies in accordance with another embodiment of the present invention.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

Figure 1:
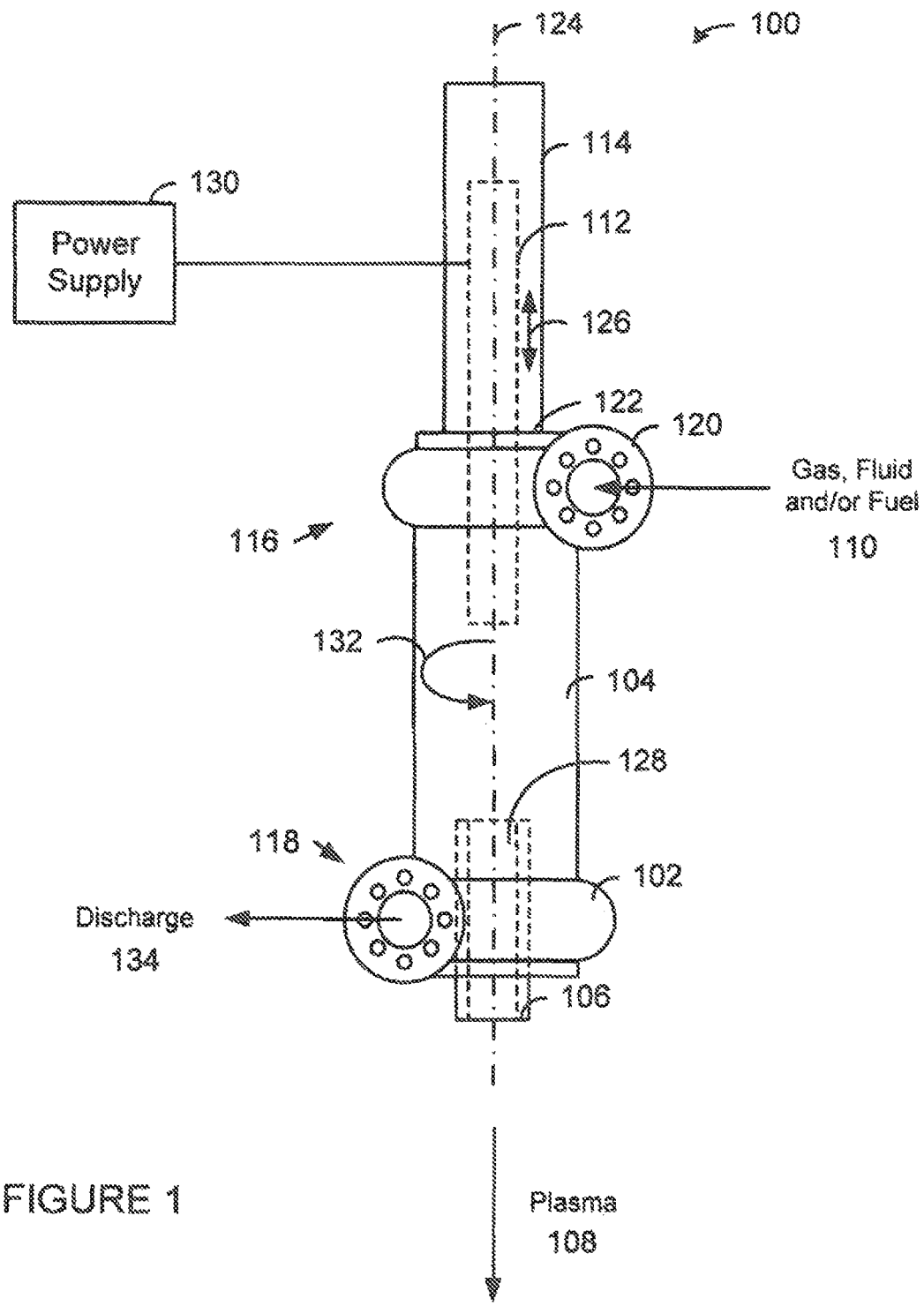
FIG. 1 is a diagram of a plasma arc torch in accordance with one embodiment of the present invention.

Now referring to FIG. 1, a plasma arc torch 100 in accordance with one embodiment of the present invention is shown. The plasma arc torch 100 is a modified version of the ARCWHIRL® device disclosed in U.S. Pat. No. 7,422,695 (which is hereby incorporated by reference in its entirety) that produces unexpected results. More specifically, by attaching a discharge volute 102 to the bottom of the vessel 104, closing off the vortex finder, replacing the bottom electrode with a hollow electrode nozzle 106, an electrical arc can be maintained while discharging plasma 108 through the hollow electrode nozzle 106 regardless of how much gas (e.g., air), fluid (e.g., water) or steam 110 is injected into plasma arc torch 100. In addition, when a valve (not shown) is connected to the discharge volute 102, the mass flow of plasma 108 discharged from the hollow electrode nozzle 106 can be controlled by throttling the valve (not shown) while adjusting the position of the first electrode 112 using the linear actuator 114.

As a result, plasma arc torch 100 includes a cylindrical vessel 104 having a first end 116 and a second end 118. A tangential inlet 120 is connected to or proximate to the first end 116 and a tangential outlet 136 (discharge volute) is connected to or proximate to the second end 118. An electrode housing 122 is connected to the first end 116 of the cylindrical vessel 104 such that a first electrode 112 is aligned with the longitudinal axis 124 of the cylindrical vessel 104, extends into the cylindrical vessel 104, and can be moved along the longitudinal axis 124. Moreover, a linear actuator 114 is connected to the first electrode 112 to adjust the position of the first electrode 112 within the cylindrical vessel 104 along the longitudinal axis of the cylindrical vessel 124 as indicated by arrows 126. The hollow electrode nozzle 106 is connected to the second end 118 of the cylindrical vessel 104 such that the center line of the hollow electrode nozzle 106 is aligned with the longitudinal axis 124 of the cylindrical vessel 104. The shape of the hollow portion 128 of the hollow electrode nozzle 106 can be cylindrical or conical. Moreover, the hollow electrode nozzle 106 can extend to the second end 118 of the cylindrical vessel 104 or extend into the cylindrical vessel 104 as shown. As shown in FIG. 1, the tangential inlet 120 is volute attached to the first end 116 of the cylindrical vessel 104, the tangential outlet 136 is a volute attached to the second end 118 of the cylindrical vessel 104, the electrode housing 122 is connected to the inlet volute 120, and the hollow electrode nozzle 106 (cylindrical configuration) is connected to the discharge volute 102. Note that the plasma arc torch 100 is not shown to scale.

A power supply 130 is electrically connected to the plasma arc torch 100 such that the first electrode 112 serves as the cathode and the hollow electrode nozzle 106 serves as the anode. The voltage, power and type of the power supply 130 is dependant upon the size, configuration and function of the plasma arc torch 100. A gas (e.g., air), fluid (e.g., water) or steam 110 is introduced into the tangential inlet 120 to form a vortex 132 within the cylindrical vessel 104 and exit through the tangential outlet 136 as discharge 134. The vortex 132 confines the plasma 108 within in the vessel 104 by the inertia (inertial confinement as opposed to magnetic confinement) caused by the angular momentum of the vortex, whirling, cyclonic or swirling flow of the gas (e.g., air), fluid (e.g., water) or steam 110 around the interior of the cylindrical vessel 104. During startup, the linear actuator 114 moves the first electrode 112 into contact with the hollow electrode nozzle 106 and then draws the first electrode 112 back to create an electrical arc which forms the plasma 108 that is discharged through the hollow electrode nozzle 106. During operation, the linear actuator 114 can adjust the position of the first electrode 112 to change the plasma 108 discharge or account for extended use of the first electrode 112.

Figure 2:
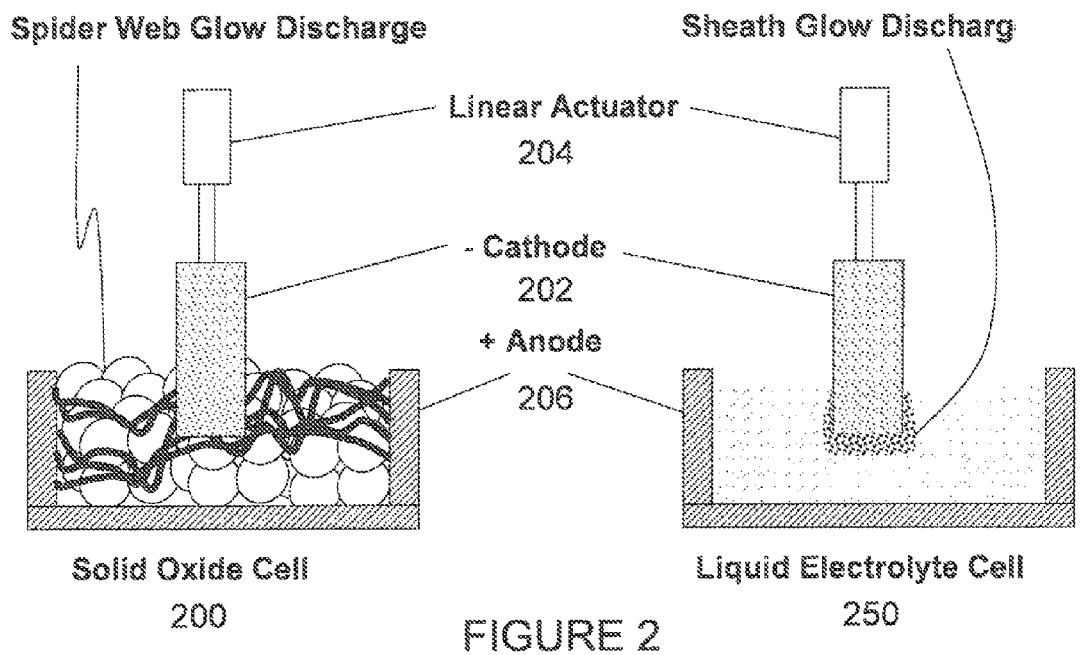
FIG. 2 is a cross-sectional view comparing and contrasting a solid oxide cell to a liquid electrolyte cell in accordance with one embodiment of the present invention.

Referring now to FIG. 2, a cross-sectional view comparing and contrasting a solid oxide cell 200 to a liquid electrolyte cell 250 in accordance with one embodiment of the present invention is shown. An experiment was conducted using the Liquid Electrolyte Cell 250. A carbon cathode 202 was connected to a linear actuator 204 in order to raise and lower the cathode 202 into a carbon anode crucible 206. An ESAB ESP 150 DC power supply rated at 150 amps and an open circuit voltage ("OCV") of 370 VDC was used for the test. The power supply was "tricked out" in order to operate at OCV.

In order to determine the sheath glow discharge length on the cathode 202 as well as measure amps and volts the power supply was turned on and then the linear actuator 204 was used to lower the cathode 202 into an electrolyte solution of water and baking soda. Although a steady glow discharge could be obtained the voltage and amps were too erratic to record. Likewise, the power supply constantly surged and pulsed due to erratic current flow. As soon as the cathode 202 was lowered too deep, the glow discharge ceased and the cell went into an electrolysis mode. In addition, since boiling would occur quite rapidly and the electrolyte would foam up and go over the sides of the carbon crucible 206, foundry sand was added reduce the foam in the crucible 206.

The 8" diameter anode crucible 206 was filled with sand and the electrolyte was added to the crucible. Power was turned on and the cathode 202 was lowered into the sand and electrolyte. Unexpectedly, a glow discharge was formed immediately, but this time it appeared to spread out laterally from the cathode 202. A large amount of steam was produced such that it could not be seen how far the glow discharge had extended through the sand.

Figure 3:
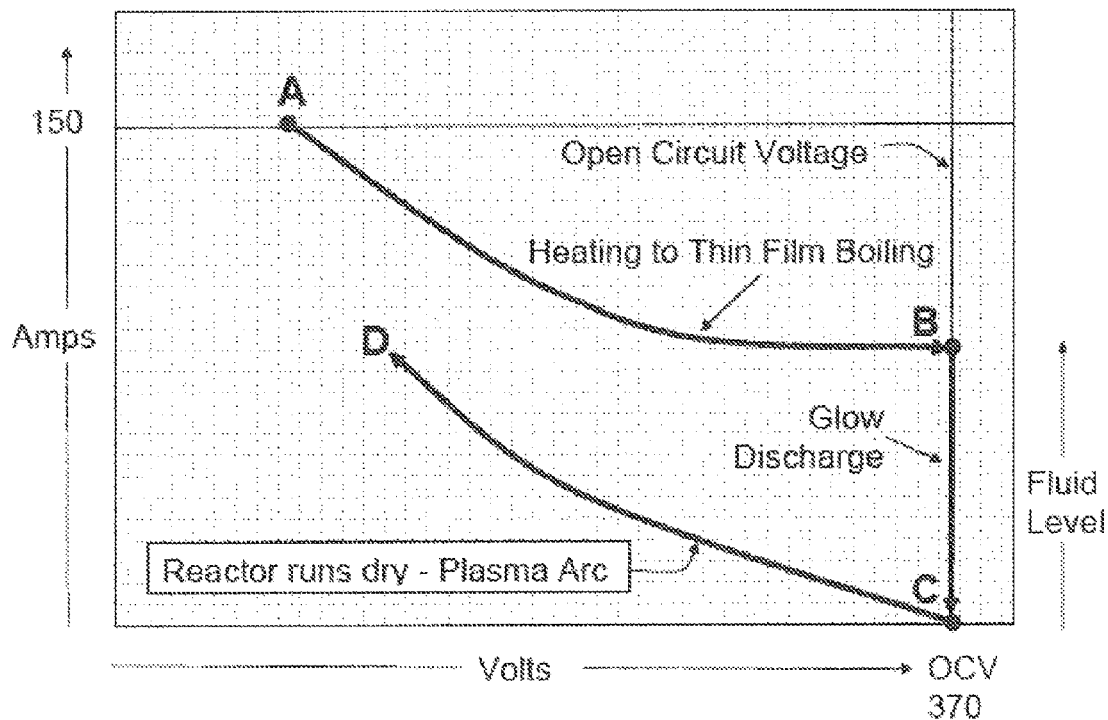
FIG. 3 is a graph showing an operating curve a glow discharge cell in accordance with one embodiment of the present invention.

Next, the sand was replaced with commonly available clear floral marbles. When the cathode 202 was lowered into the marbles and baking soda/water solution, the electrolyte began to slowly boil. As soon as the electrolyte began to boil a glow discharge spider web could be seen throughout the marbles as shown the Solid Oxide Cell 200. Although this was completely unexpected at a much lower voltage than what has been disclosed and published, what was completely unexpected is that the DC power supply did not surge, pulse or operate erratically in any way. A graph showing an operating curve for a glow discharge cell in accordance with the present invention is shown in FIG. 3 based on various tests. The data is completely different from what is currently published with respect to glow discharge graphs and curves developed from currently known electroplasma, plasma electrolysis or glow discharge reactors. Glow discharge cells can evaporate or concentrate liquids while generating steam.

Now referring to FIG. 4, a cross-sectional view of a glow discharge cell 400 in accordance with one embodiment of the present invention is shown. The glow discharge cell 400 includes an electrically conductive cylindrical vessel 402 having a first end 404 and a second end 406, and at least one inlet 408 and one outlet 410. A hollow electrode 412 is aligned with a longitudinal axis of the cylindrical vessel 402 and extends at least from the first end 404 to the second end 406 of the cylindrical vessel 402. The hollow electrode 412 also has an inlet 414 and an outlet 416. A first insulator 418 seals the first end 404 of the cylindrical vessel 402 around the hollow electrode 412 and maintains a substantially equidistant gap 420 between the cylindrical vessel 402 and the hollow electrode 412. A second insulator 422 seals the second end 406 of the cylindrical vessel 402 around the hollow electrode 412 and maintains the substantially equidistant gap 420 between the cylindrical vessel 402 and the hollow electrode 412. A non-conductive granular material 424 is disposed within the gap 420, wherein the non-conductive granular material 424 (a) allows an electrically conductive fluid to flow between the cylindrical vessel 402 and the hollow electrode 412, and (b) prevents electrical arcing between the cylindrical vessel 402 and the hollow electrode 412 during a electric glow discharge. The electric glow discharge is created whenever: (a) the glow discharge cell 400 is connected to an electrical power source such that the cylindrical vessel 402 is an anode and the hollow electrode 412 is a cathode, and (b) the electrically conductive fluid is introduced into the gap 420.

The vessel 402 can be made of stainless steel and the hollow electrode can be made of carbon. The non-conductive granular material 424 can be marbles, ceramic beads, molecular sieve media, sand, limestone, activated carbon, zeolite, zirconium, alumina, rock salt, nut shell or wood chips. The electrical power supply can operate in a range from 50 to 500 volts DC, or a range of 200 to 400 volts DC. The cathode 412 can reach a temperature of at least 500° C., at least 1000° C., or at least 2000° C. during the electric glow discharge. The electrically conductive fluid comprises water, produced water, wastewater, tailings pond water, or other suitable fluid. The electrically conductive fluid can be created by adding an electrolyte, such as baking soda, Nahcolite, lime, sodium chloride, ammonium sulfate, sodium sulfate or carbonic acid, to a fluid.

Referring now to FIG. 5, a cross-sectional view of a glow discharge cell 500 in accordance with another embodiment of the present invention is shown. The glow discharge cell 500 includes an electrically conductive cylindrical vessel 402 having a first end 404 and a closed second end 502, an inlet proximate 408 to the first end 404, and an outlet 410 centered in the closed second end 502. A hollow electrode 504 is aligned with a longitudinal axis of the cylindrical vessel and extends at least from the first end 404 into the cylindrical vessel 402. The hollow electrode 504 has an inlet 414 and an outlet 416. A first insulator 418 seals the first end 404 of the cylindrical vessel 402 around the hollow electrode 504 and maintains a substantially equidistant gap 420 between the cylindrical vessel 402 and the hollow electrode 504. A non-conductive granular material 424 is disposed within the gap 420, wherein the non-conductive granular material 424 (a) allows an electrically conductive fluid to flow between the cylindrical vessel 402 and the hollow electrode 504, and (b) prevents electrical arcing between the cylindrical vessel 402 and the hollow electrode 504 during a electric glow discharge. The electric glow discharge is created whenever: (a) the glow discharge cell 500 is connected to an electrical power source such that the cylindrical vessel 402 is an anode and the hollow electrode 504 is a cathode, and (b) the electrically conductive fluid is introduced into the gap 420.

The following examples will demonstrate the capabilities, usefulness and completely unobvious and unexpected results.

Example 1—Black Liquor

Figure 6:
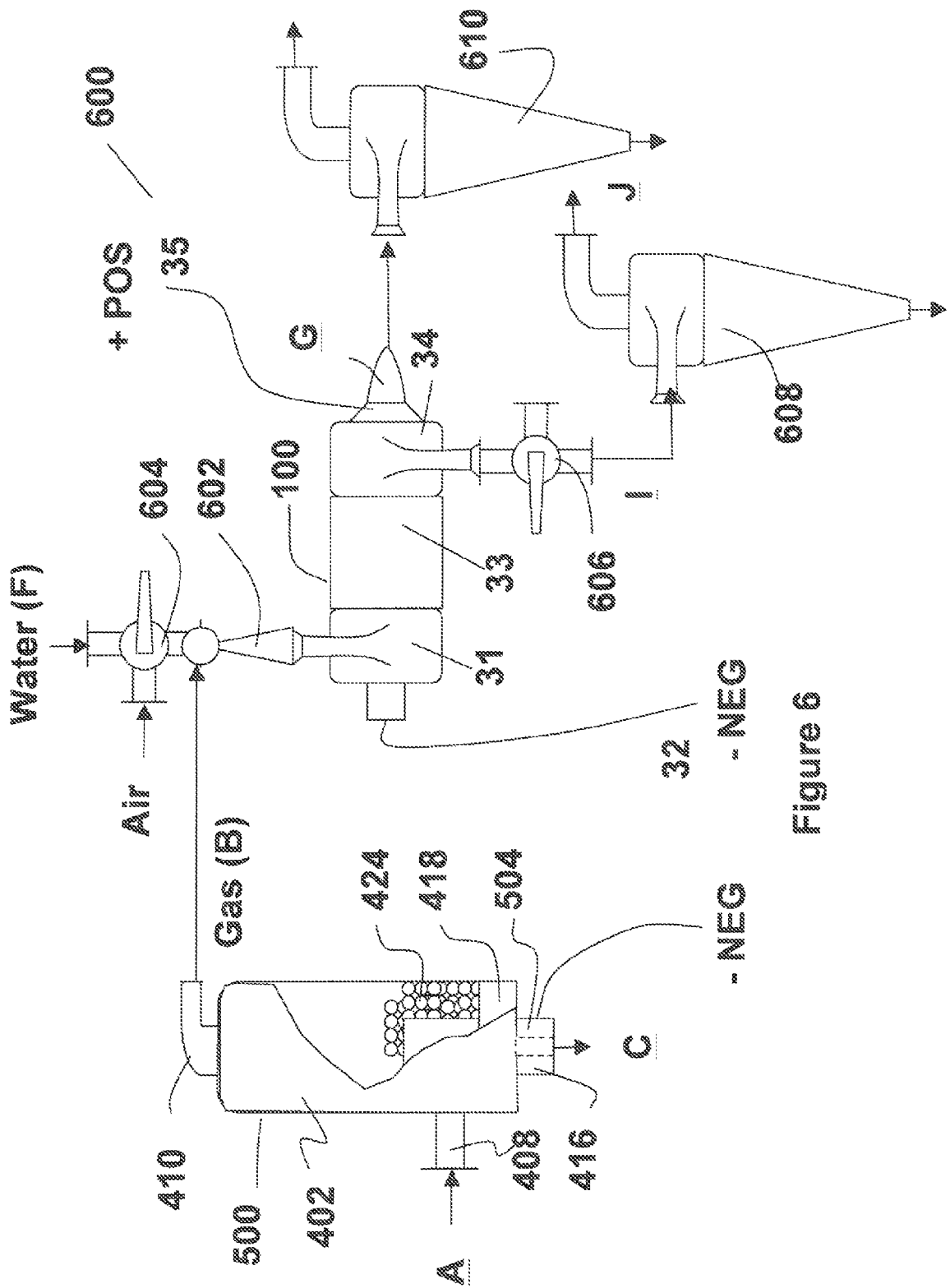
FIG. 6 is a cross-sectional view of a Solid Oxide Plasma Arc Torch System in accordance with another embodiment of the present invention.

Now referring to FIG. 6, a cross-sectional view of a Solid Oxide Plasma Arc Torch System 600 in accordance with another embodiment of the present invention is shown. A plasma arc torch 100 is connected to the cell 500 via an eductor 602. Once again the cell 500 was filled with a baking soda and water solution. A pump was connected to the first volute 31 of the plasma arc torch 100 via a 3-way valve 604 and the eductor 602. The eductor 602 pulled a vacuum on the cell 500. The plasma exiting from the plasma arc torch 100 dramatically increased in size. Hence, a non-condensable gas B was produced within the cell 500. The color of the arc within the plasma arc torch 100 when viewed through the sightglass 33 changed colors due to the gases produced from the HiTemper™ cell 500. Next, the 3-way valve 604 was adjusted to allow air and water F to flow into the first volute 31 of plasma arc torch 100. The additional mass flow increased the plasma G exiting from the plasma arc torch 100. Several pieces of stainless steel round bar were placed at the tip of the plasma G and melted to demonstrate the systems capabilities. Likewise, wood was carbonized by placing it within the plasma stream G. Thereafter the plasma G exiting from the plasma torch 100 was directed into cyclone separator 610. The water and gases I exiting from the plasma arc torch 100 via second volute 34 flowed into a hydrocyclone 608 via a valve 606. This allowed for rapid mixing and scrubbing of gases with the water in order to reduce the discharge of any hazardous contaminants.

A sample of black liquor with 16% solids obtained from a pulp and paper mill was charged to the glow discharge cell 500 in a sufficient volume to cover the floral marbles 424. In contrast to other glow discharge or electro plasma systems the solid oxide glow discharge cell does not require preheating of the electrolyte. The ESAB ESP 150 power supply was turned on and the volts and amps were recorded by hand. Referring briefly to FIG. 3, as soon as the power was turned on to the cell 500, the amp meter pegged out at 150. Hence, the name of the ESAB power supply—ESP 150. It is rated at 150 amps. The voltage was steady between 90 and 100 VDC. As soon as boiling occurred the voltage steadily climbed to OCV (370 VDC) while the amps dropped to 75.

The glow discharge cell 500 was operated until the amps fell almost to zero. Even at very low amps of less than 10 the voltage appeared to be locked on at 370 VDC. The cell 500 was allowed to cool and then opened to examine the marbles 424. It was surprising that there was no visible liquid left in the cell 500 but all of the marbles 424 were coated or coked with a black residue. The marbles 424 with the black residue were shipped off for analysis. The residue was in the bottom of the container and had come off of the marbles 424 during shipping. The analysis is listed in the table below, which demonstrates a novel method for concentrating black liquor and coking organics. With a starting solids concentration of 16%, the solids were concentrated to 94.26% with only one evaporation step. Note that the sulfur ("S") stayed in the residue and did not exit the cell 500.

Total Solids % 94.26
Ash %/ODS 83.64
ICP metal scan: results are reported on ODS basis

TABLE

| Black Liquor Results | | |
|---|---|---|
| Metal Scan | Unit | F80015 |
| Aluminum, Al | mg/kg | 3590* |
| Arsenic, As | mg/kg | <50 |
| Barium, Ba | mg/kg | 2240* |
| Boron, B | mg/kg | 60 |
| Cadmium, Cd | mg/kg | 2 |
| Calcium, Ca | mg/kg | 29100* |
| Chromium, Cr | mg/kg | 31 |
| Cobalt, Co | mg/kg | <5 |
| Copper, Cu | mg/kg | 19 |
| Iron, Fe | mg/kg | 686* |
| Lead, Pb | mg/kg | <20 |
| Lithium, Li | mg/kg | 10 |
| Magnesium, Mg | mg/kg | 1710* |
| Manganese, Mn | mg/kg | 46.2 |
| Molybdenum, Mo | mg/kg | 40 |
| Nickel, Ni | mg/kg | <100 |
| Phosphorus, P | mg/kg | 35 |
| Potassium, K | mg/kg | 7890 |
| Silicon, Si | mg/kg | 157000* |
| Sodium, Na | mg/kg | 102000 |
| Strontium, Sr | mg/kg | <20 |
| Sulfur, S | mg/kg | 27200* |
| Titanium, Ti | mg/kg | 4 |
| Vanadium, V | mg/kg | 1.7 |
| Zinc, Zn | mg/kg | 20 |

This method can be used for concentrating black liquor from pulp, paper and fiber mills for subsequent recaustizing.

As can be seen in FIG. 3, if all of the liquid evaporates from the cell 500 and it is operated only with a solid electrolyte, electrical arc over from the cathode to anode may occur. This has been tested in which case a hole was blown through the stainless steel vessel 402. Electrical arc over can easily be prevented by (1) monitoring the liquid level in the cell and do not allow it to run dry, and (2) monitoring the amps (Low amps=Low liquid level). If electrical arc over is desirable or the cell must be designed to take an arc over, then the vessel 402 should be constructed of carbon.

Example 2—ARCWHIRL® Plasma Torch Attached to Solid Oxide Cell

Figure 7:
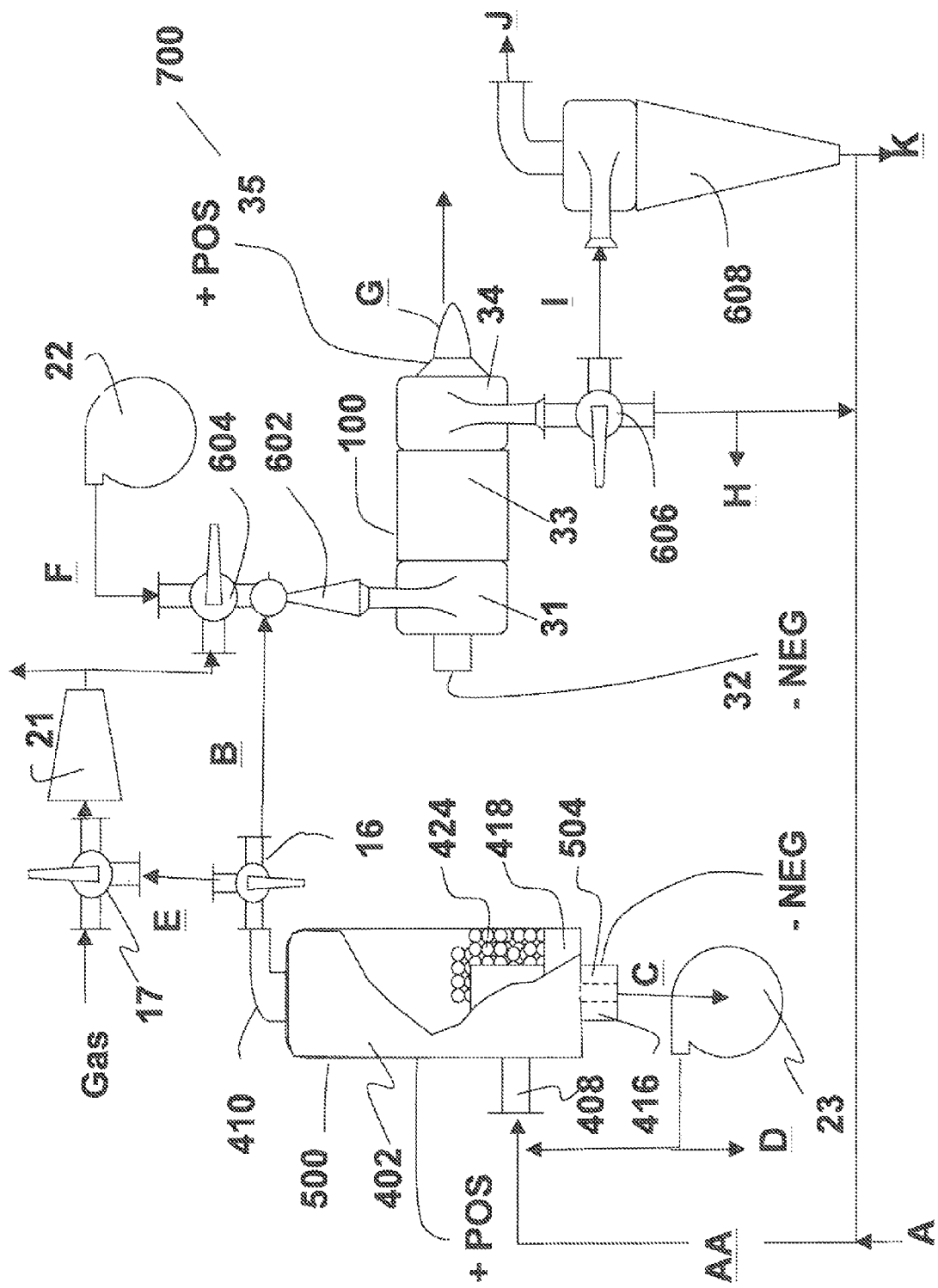
FIG. 7 is a cross-sectional view of a Solid Oxide Plasma Arc Torch System in accordance with another embodiment of the present invention.

Referring now to FIG. 7, a cross-sectional view of a Solid Oxide Plasma Arc Torch System 700 in accordance with another embodiment of the present invention is shown. A plasma arc torch 100 is connected to the cell 500 via an eductor 602. Once again the cell 500 was filled with a baking soda and water solution. Pump 23 recirculates the baking soda and water solution from the outlet 416 of the hollow electrode 504 to the inlet 408 of the cell 500. A pump 22 was connected to the first volute 31 of the plasma arc torch 100 via a 3-way valve 604 and the eductor 602. An air compressor 21 was used to introduce air into the 3-way valve 604 along with water F from the pump 22. The pump 22 was turned on and water F flowed into the first volute 31 of the plasma arc torch 100 and through a full view site glass 33 and exited the torch 30 via a second volute 34. The plasma arc torch 100 was started by pushing a carbon cathode rod (−NEG) 32 to touch and dead short to a positive carbon anode (+POS) 35. A very small plasma G exited out of the anode 35. Next, the High Temperature Plasma Electrolysis Reactor (Cell) 500 was started in order to produce a plasma gas B. Once again at the onset of boiling voltage climbed to OCV (370 VDC) and a gas began flowing to the plasma arc torch 100. The eductor 602 pulled a vacuum on the cell 500. The plasma G exiting from the plasma arc torch 100 dramatically increased in size. Hence, a non-condensable gas B was produced within the cell 500. The color of the arc within the plasma arc torch 100 when viewed through the sightglass 33 changed colors due to the gases produced from the HiTemper™ cell 500. Next, the 3-way valve 604 was adjusted to allow air from compressor 21 and water from pump 22 to flow into the plasma arc torch 100. The additional mass flow increased the plasma G exiting from the plasma arc torch 100. Several pieces of stainless steel round bar were placed at the tip of the plasma G and melted to demonstrate the systems capabilities. Likewise, wood was carbonized by placing it within the plasma stream G. The water and gases exiting from the plasma arc torch 100 via volute 34 flowed into a hydrocyclone 608. This allowed for rapid mixing and scrubbing of gases with the water in order to reduce the discharge of any hazardous contaminants.

Next, the system was shut down and a second cyclone separator 610 was attached to the plasma arc torch 100 as shown in FIG. 5. Once again the Solid Oxide Plasma Arc Torch System was turned on and a plasma G could be seen circulating within the cyclone separator 610. Within the eye or vortex of the whirling plasma G was a central core devoid of any visible plasma.

The cyclone separator 610 was removed to conduct another test. To determine the capabilities of the Solid Oxide Plasma Arc Torch System as shown in FIG. 6, the pump 22 was turned off and the system was operated only on air provided by compressor 21 and gases B produced from the solid oxide cell 500. Next, 3-way valve 606 was slowly closed in order to force all of the gases through the arc to form a large plasma G exiting from the hollow carbon anode 35.

Next, the 3-way valve 604 was slowly closed to shut the flow of air to the plasma arc torch 100. What happened was completely unexpected. The intensity of the light from the sightglass 33 increased dramatically and a brilliant plasma was discharged from the plasma arc torch 100. When viewed with a welding shield the arc was blown out of the plasma arc torch 100 and wrapped back around to the anode 35. Thus, the Solid Oxide Plasma Arc Torch System will produce a gas and a plasma suitable for welding, melting, cutting, spraying and chemical reactions such as pyrolysis, gasification and water gas shift reaction.

Example 3—Phosphogypsum Pond Water

The phosphate industry has truly left a legacy in Florida, Louisiana and Texas that will take years to cleanup—gypsum stacks and pond water. On top of every stack is a pond. Pond water is recirculated from the pond back down to the plant and slurried with gypsum to go up the stack and allow the gypsum to settle out in the pond. This cycle continues and the gypsum stack increases in height. The gypsum is produced as a byproduct from the ore extraction process.

There are two major environmental issues with every gyp stack. First, the pond water has a very low pH. It cannot be discharged without neutralization. Second, the phosphogypsum contains a slight amount of radon. Thus, it cannot be used or recycled to other industries. The excess water in combination with ammonia contamination produced during the production of P2O5 fertilizers such as diammonium phosphate ("DAP") and monoammonium phosphate ("MAP") must be treated prior to discharge. The excess pond water contains about 2% phosphate a valuable commodity.

A sample of pond water was obtained from a Houston phosphate fertilizer company. The pond water was charged to the solid oxide cell 500. The Solid Oxide Plasma Arc Torch System was configured as shown in FIG. 6. The 3-way valve 606 was adjusted to flow only air into the plasma arc torch 100 while pulling a vacuum on cell 500 via eductor 602. The hollow anode 35 was blocked in order to maximize the flow of gases I to hydrocyclone 608 that had a closed bottom with a small collection vessel. The hydrocyclone 608 was immersed in a tank in order to cool and recover condensable gases.

The results are disclosed in FIG. 10—Tailings Pond Water Results. The goal of the test was to demonstrate that the Solid Oxide Glow Discharge Cell could concentrate up the tailings pond water. Turning now to cycles of concentration, the percent P2O5 was concentrated up by a factor of 4 for a final concentration of 8.72% in the bottom of the HiTemper™ cell 500. The beginning sample as shown in the picture is a colorless, slightly cloudy liquid. The bottoms or concentrate recovered from the HiTemper cell 500 was a dark green liquid with sediment. The sediment was filtered and are reported as SOLIDS (Retained on Whatmann #40 filter paper). The percent SO4 recovered as a solid increased from 3.35% to 13.6% for a cycles of concentration of 4. However, the percent Na recovered as a solid increased from 0.44% to 13.67% for a cycles of concentration of 31.

The solid oxide or solid electrolyte 424 used in the cell 500 were floral marbles (Sodium Oxide). Floral marbles are made of sodium glass. Not being bound by theory it is believed that the marbles were partially dissolved by the phosphoric acid in combination with the high temperature glow discharge. Chromate and Molybdenum cycled up and remained in solution due to forming a sacrificial anode from the stainless steel vessel 402. Note: Due to the short height of the cell carryover occurred due to pulling a vacuum on the cell 500 with eductor 602. In the first run (row 1 HiTemper) of FIG. 10 very little fluorine went overhead. That had been a concern from the beginning that fluorine would go over head. Likewise about 38% of the ammonia went overhead. It was believed that all of the ammonia would flash and go overhead.

A method has been disclosed for concentrating $P_2O_5$ from tailings pond for subsequent recovery as a valuable commodity acid and fertilizer.

Now, returning back to the black liquor sample, not being bound by theory it is believed that the black liquor can be recaustisized by simply using CaO or limestone as the solid oxide electrolyte 424 within the cell 500. Those who are skilled in the art of producing pulp and paper will truly understand the benefits and cost savings of not having to run a lime kiln. However, if the concentrated black liquor must be gasified or thermally oxidized to remove all carbon species, the marbles 424 can be treated with the plasma arc torch 100. Referring back to FIG. 6, the marbles 424 coated with the concentrated black liquor or the concentrated black liquor only is injected between the plasma arc torch 100 and the cyclone separator 610. This will convert the black liquor into a green liquor or maybe a white liquor. The marbles 424 may be flowed into the plasma arc torch nozzle 31 and quenched in the whirling lime water and discharged via volute 34 into hydrocyclone 608 for separation and recovery of both white liquor and the marbles 424. The lime will react with the NaO to form caustic and an insoluble calcium carbonate precipitate.

Example 4—Evaporation, Vapor Compression and Steam Generation for EOR and Industrial Steam Users Turning to FIG. 4, several oilfield wastewaters were evaporated in the cell 400. In order to enhance evaporation the suction side of a vapor compressor (not shown) can be connected to upper outlet 410. The discharge of the vapor compressor would be connected to 416. Not being bound by theory, it is believed that alloys such as Kanthal® manufactured by the Kanthal® corporation may survive the intense effects of the cell as a tubular cathode 412, thus allowing for a novel steam generator with a superheater by flowing the discharge of the vapor compressor through the tubular cathode 412. Such an apparatus, method and process would be widely used throughout the upstream oil and gas industry in order to treat oilfield produced water and frac flowback.

Several different stainless steel tubulars were tested within the cell 500 as the cathode 12. In comparison to the sheath glow discharge the tubulars did not melt. In fact, when the tubulars were pulled out, a marking was noticed at every point a marble was in contact with the tube.

This gives rise to a completely new method for using glow discharge to treat metals.

Example 5—Treating Tubes, Bars, Rods, Pipe or Wire

There are many different companies applying glow discharge to treat metal. However, many have companies have failed miserably due to arcing over and melting the material to be coated, treated or descaled. The problem with not being able to control voltage leads to spikes. By simply adding sand or any solid oxide to the cell and feeding the tube cathode 12 through the cell 500 as configured in FIG. 2, the tube, rod, pipe, bars or wire can be treated at a very high federate.

Example 6—Solid Oxide Plasma Arc Torch

There truly exists a need for a very simple plasma torch that can be operated with dirty or highly polluted water such as sewage flushed directly from a toilet which may contain toilet paper, feminine napkins, fecal matter, pathogens, urine and pharmaceuticals. A plasma torch system that could operate on the aforementioned waters could potentially dramatically affect the wastewater infrastructure and future costs of maintaining collection systems, lift stations and wastewater treatment facilities.

By converting the contaminated wastewater to a gas and using the gas as a plasma gas could also alleviate several other growing concerns—municipal solid waste going to landfills, grass clippings and tree trimmings, medical waste, chemical waste, refinery tank bottoms, oilfield wastes such as drill cuttings and typical everyday household garbage. A simple torch system which could handle both solid waste and liquids or that could heat a process fluid while gasifying biomass or coal or that could use a wastewater to produce a plasma cutting gas would change many industries overnight.

One industry in particular is the metals industry. The metals industry requires a tremendous amount of energy and exotic gases for heating, melting, welding, cutting and machining.

Figure 8:
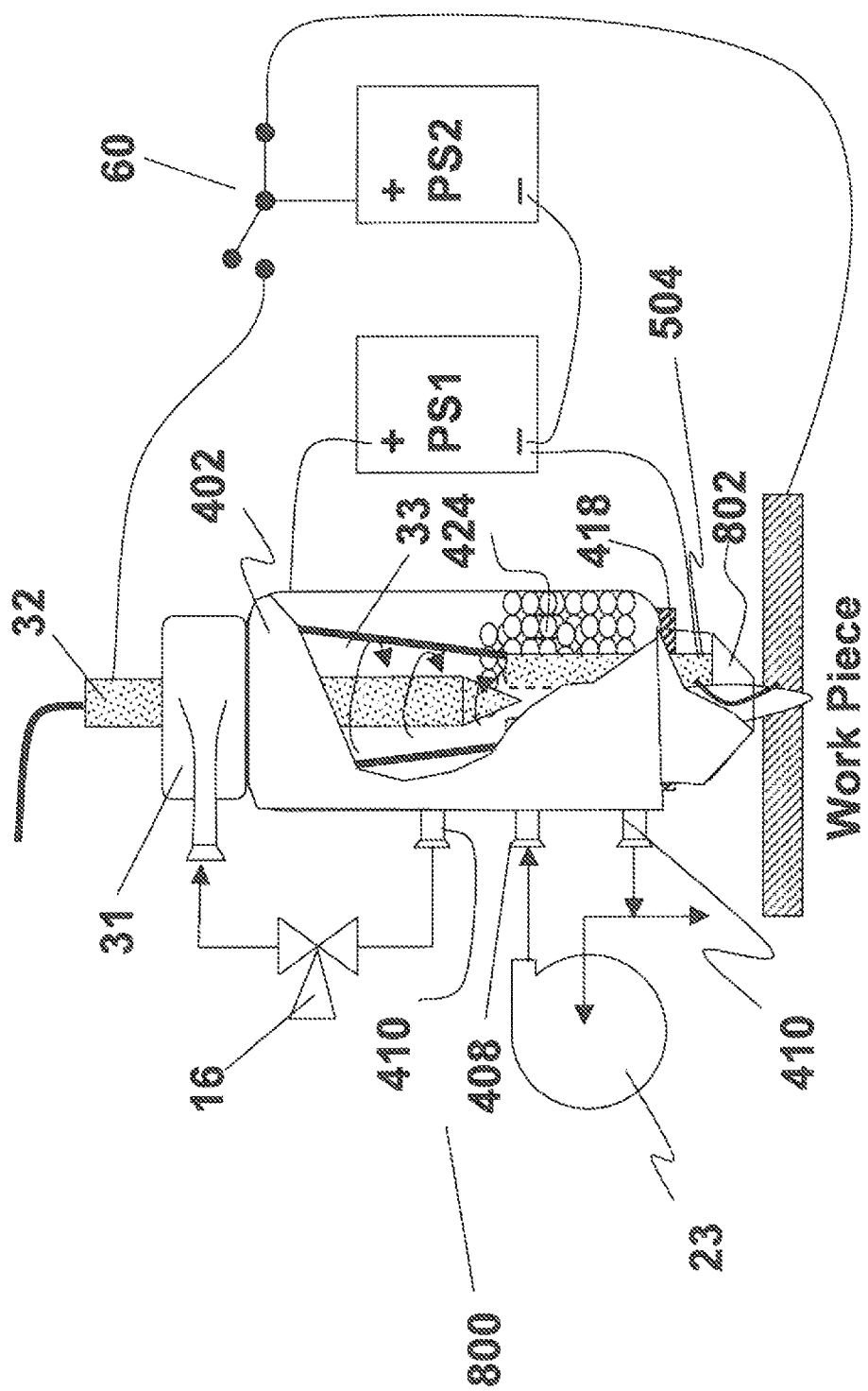
FIG. 8 is a cross-sectional view of a Solid Oxide Transferred Arc Plasma Torch in accordance with another embodiment of the present invention.
Figure 9:
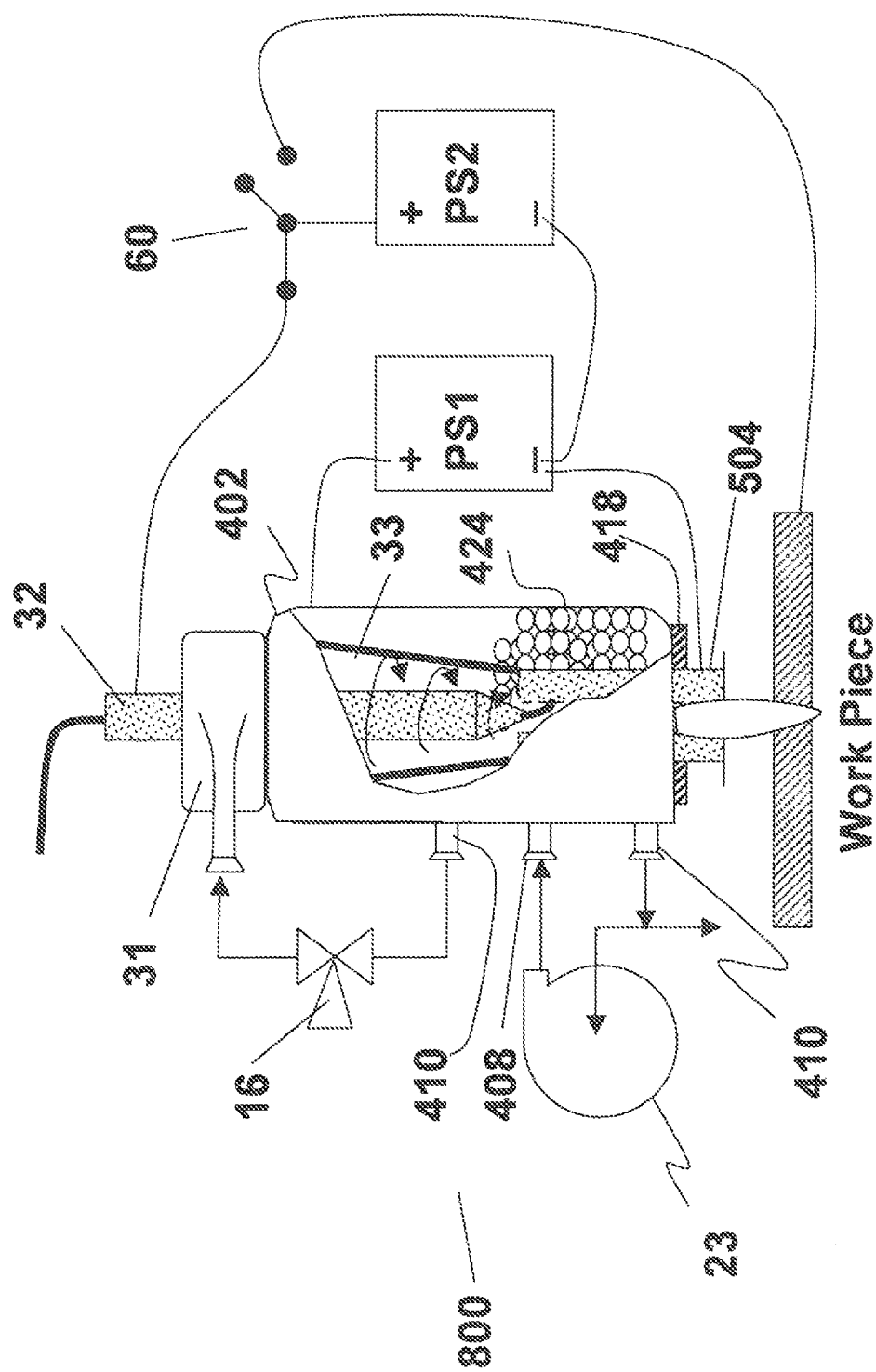
FIG. 9 is a cross-sectional view of a Solid Oxide Non-Transferred Arc Plasma Torch in accordance with another embodiment of the present invention.

Turning now to FIGS. 8 and 9, a truly novel plasma torch 800 will be disclosed in accordance with the preferred embodiments of the present invention. First, the Solid Oxide Plasma Torch is constructed by coupling the plasma arc torch 100 to the cell 500. The plasma arc torch volute 31 and electrode 32 are detached from the eductor 602 and sightglass 33. The plasma arc torch volute 31 and electrode assembly 32 are attached to the cell 500 vessel 402. The sightglass 33 is replaced with a concentric type reducer 33. It is understood that the electrode 32 is electrically isolated from the volute 31 and vessel 402. The electrode 32 is connected to a linear actuator (not shown) in order to strike the arc.

Continuous Operation of the Solid Oxide Transferred Arc Plasma Torch 800 as shown in FIG. 8 will now be disclosed for cutting or melting an electrically conductive workpiece. A fluid is flowed into the suction side of the pump and into the cell 500. The pump is stopped. A first power supply PS1 is turned on thus energizing the cell 500. As soon as the cell 500 goes into glow discharge and a gas is produced valve 16 opens allowing the gas to enter into the volute 31. The volute 31 imparts a whirl flow to the gas. A switch 60 is positioned such that a second power supply PS2 is connected to the workpiece and the −negative side of PS2 is connected to the −negative of PS1 which is connected to the centered cathode 504 of the cell 500. The entire torch is lowered so that an electrically conductive nozzle 13-C touches and is grounded to the workpiece. PS2 is now energized and the torch is raised from the workpiece. An arc is formed between cathode 504 and the workpiece.

Centering the Arc—If the arc must be centered for cutting purposes, then PS2's—negative lead would be attached to the lead of switch 60 that goes to the electrode 32. Although a series of switches are not shown for this operation, it will be understood that in lieu of manually switching the negative lead from PS2 an electrical switch similar to 60 could be used for automation purposes. The +positive lead would simply go to the workpiece as shown. A smaller electrode 32 would be used such that it could slide into and through the hollow cathode 504 in order to touch the workpiece and strike an arc. The electrically conductive nozzle 802 would be replaced with a non-conducting shield nozzle. This setup allows for precision cutting using just wastewater and no other gases.

Turning to FIG. 9, the Solid Oxide Non-Transferred Arc Plasma Torch 800 is used primarily for melting, gasifying and heating materials while using a contaminated fluid as the plasma gas. Switch 60 is adjusted such that PS2 +lead feeds electrode 32. Once again electrode 32 is now operated as the anode. It must be electrically isolated from vessel 402. When gas begins to flow by opening valve 16 the volute 31 imparts a spin or whirl flow to the gas. The anode 32 is lowered to touch the centered cathode 504. An arc is formed between the cathode 32 and anode 504. The anode may be hollow and a wire may be fed through the anode 504 for plasma spraying, welding or initiating the arc.

The entire torch is regeneratively cooled with its own gases thus enhancing efficiency. Likewise, a waste fluid is used as the plasma gas which reduces disposal and treatment costs. Finally, the plasma may be used for gasifying coal, biomass or producing copious amounts of syngas by steam reforming natural gas with the hydrogen and steam plasma.

Both FIGS. 8 and 9 have clearly demonstrated a novel Solid Oxide Plasma Arc Torch that couples the efficiencies of high temperature electrolysis with the capabilities of both transferred and non-transferred arc plasma torches.

Figure 11:
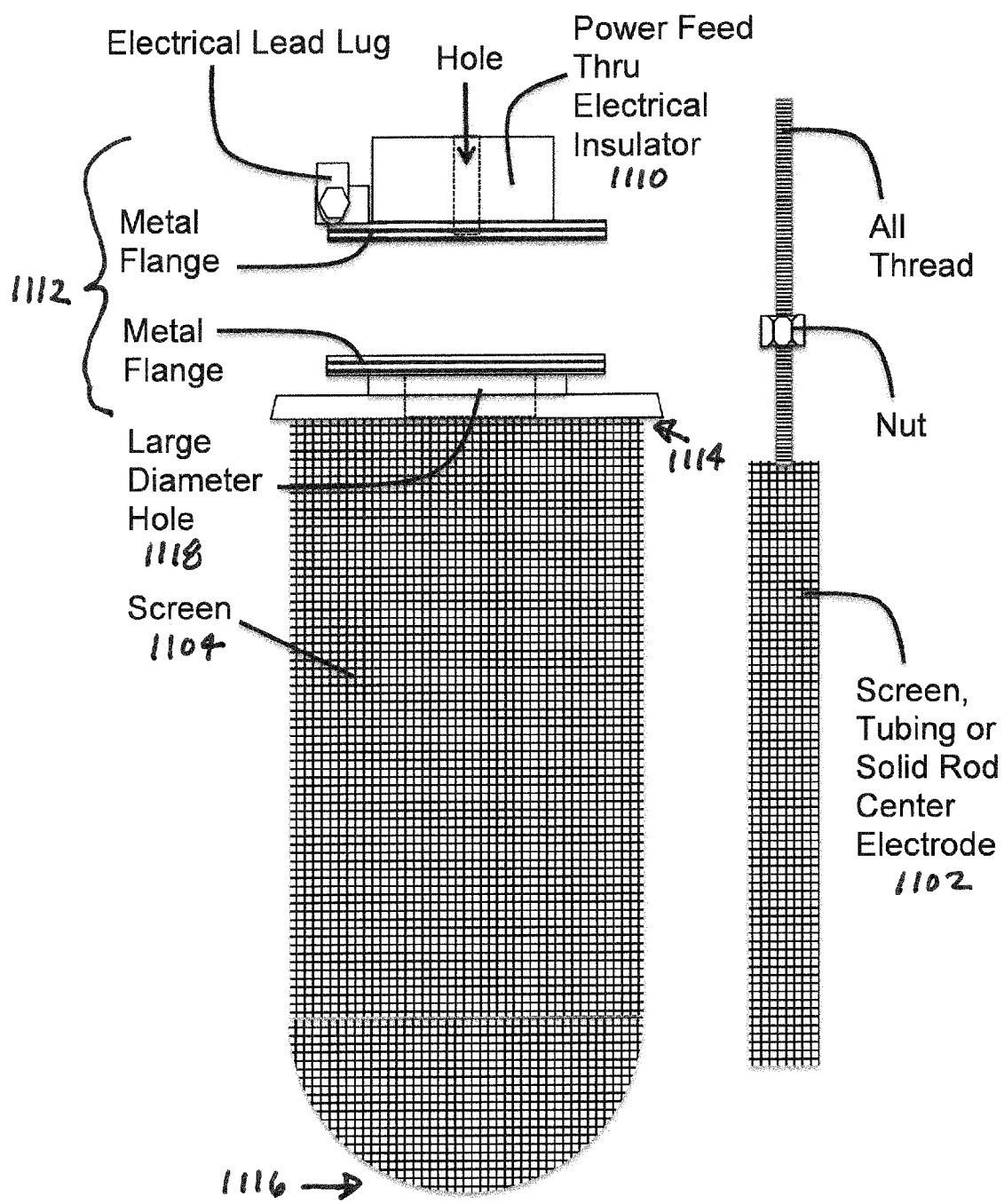
FIG. 11 is a cross-sectional view of a glow discharge electrode assembly parts in accordance with another embodiment of the present invention.
Figure 12:
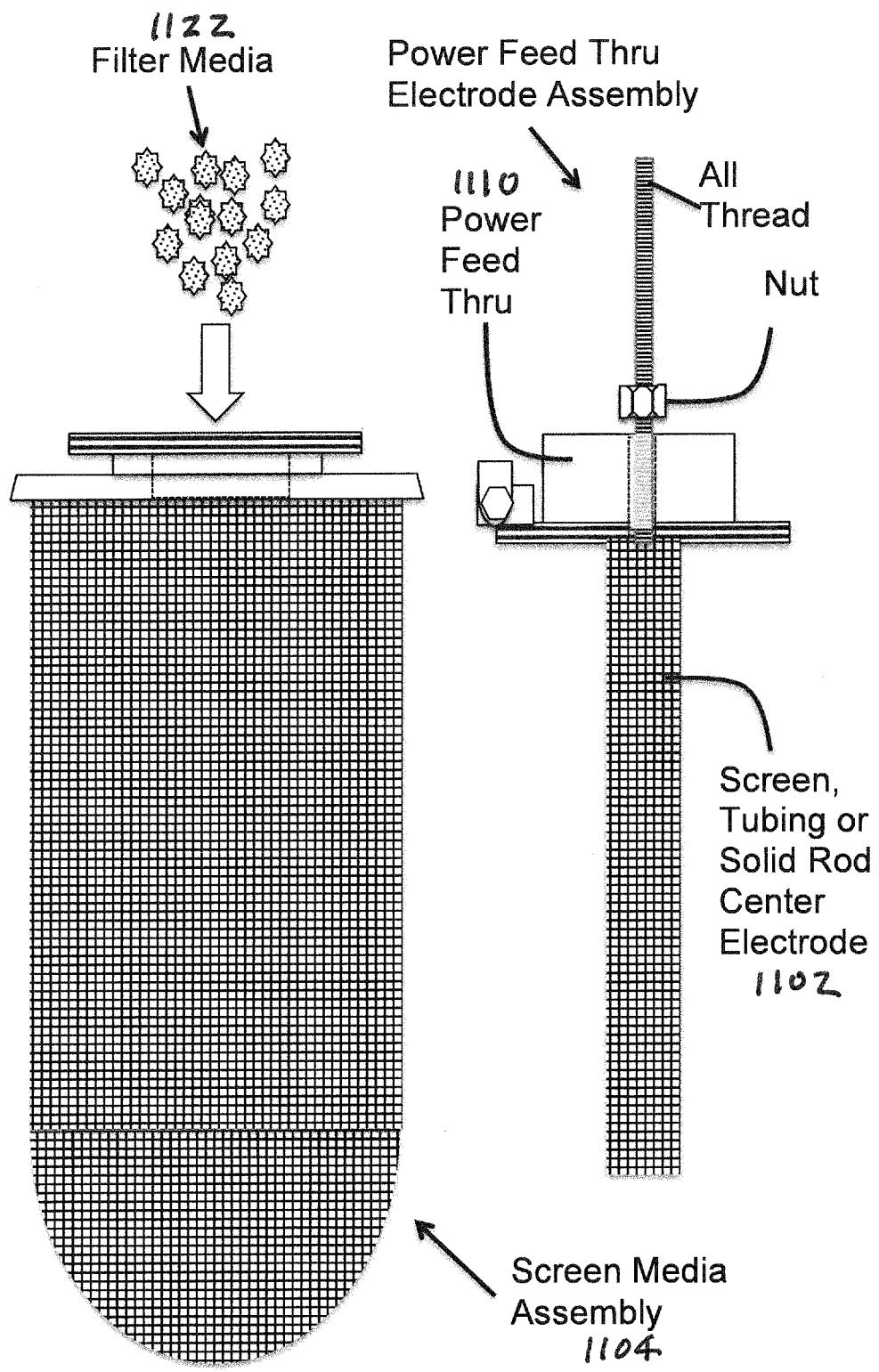
FIG. 12 is a cross-sectional view of a glow discharge electrode assembly parts in accordance with another embodiment of the present invention.
Figure 13:
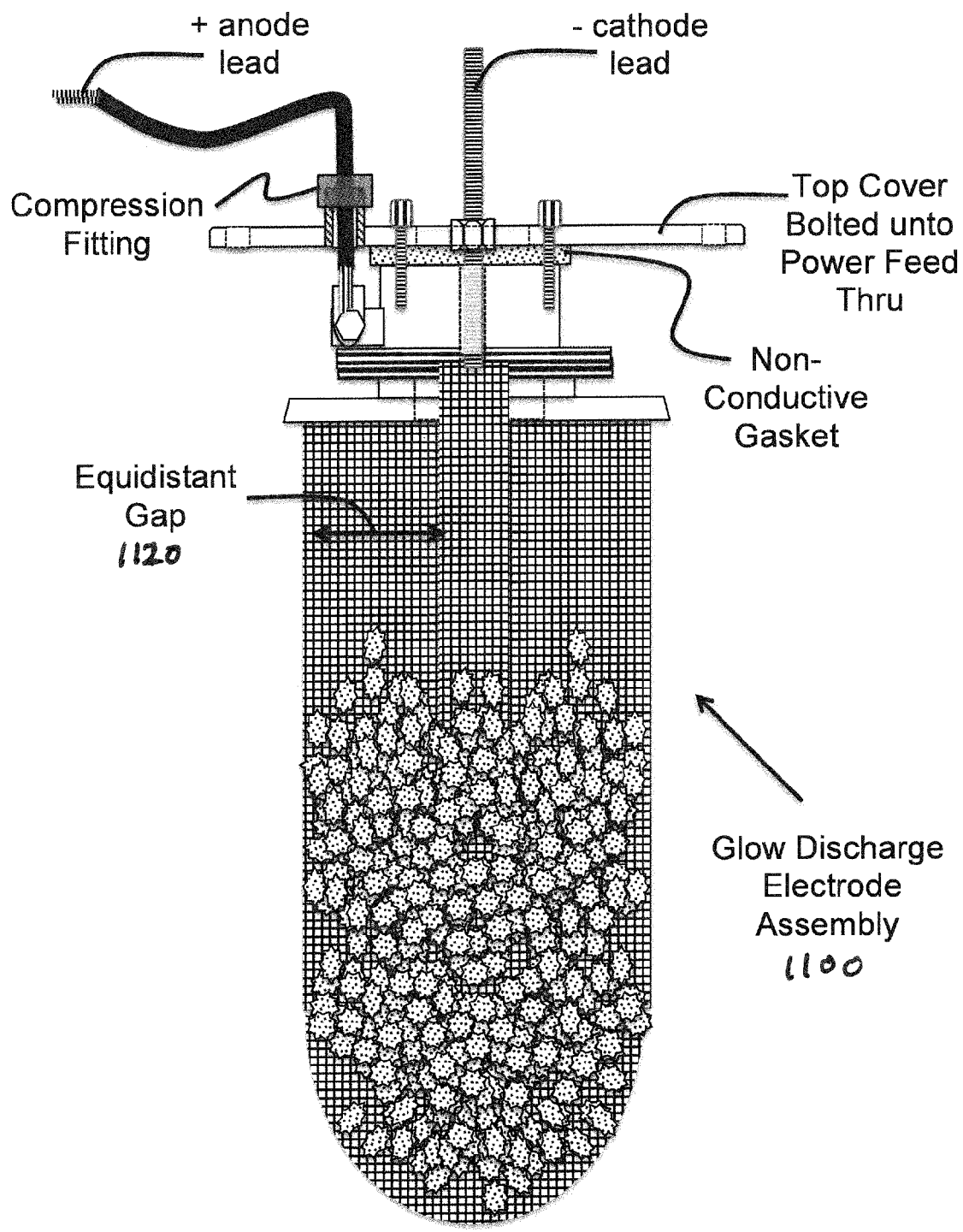
FIG. 13 is a cross-sectional view of a glow discharge electrode assembly in accordance with another embodiment of the present invention.

Turning collectively to FIGS. 11-13, a Solid Oxide Glow Discharge Electrode Assembly 1100 was constructed by inserting a first screen cathode electrode 1102 into a second screen anode electrode 1104. An annulus 1106 with an equidistant gap between the first screen 1102 and the second screen 1104 was filled with a non-conductive filter media 1108. The first screen 1102 and second screen 1104 were electrically isolated from one another with an electrical insulator more 1110 commonly referred to as a power feed thru. The electrical insulator 1110 was attached to a cover 1112.

More specifically, the glow discharge electrode assembly 1100 includes an electrically conductive cylindrical screen 1104, a flange assembly 1112, an electrode 1102, an insulator and a non-conductive granular material. The electrically conductive cylindrical screen 1104 has an open end 1114 and a closed end 1116. The flange assembly 1112 is attached to and electrically connected to the open end 1114 of the electrically conductive cylindrical screen 1104. The flange assembly 1112 has a hole 1118 with a first diameter aligned with a longitudinal axis of the electrically conductive cylindrical screen 1104. The electrode 1102 is aligned with the longitudinal axis of the electrically conductive cylindrical screen 1104 and extends through the hole 1118 of the flange assembly 1112 into the electrically conductive cylindrical screen 1104. The electrode 1102 has a second diameter that is smaller than the first diameter of the hole 1118. The electrode 1102 can be an electrically conductive screen, electrically conductive tubing, an electrically conductive rod, or other suitable component. The insulator seals the hole 1118 of the flange assembly 1112 around the electrode 1102 and maintains a substantially equidistant gap 1120 between the electrically conductive cylindrical screen 1104 and the electrode 1102. The non-conductive granular material 1122 is disposed within the substantially equidistant gap 1120, wherein (a) the non-conductive granular material 1122 allows an electrically conductive fluid to flow between the electrically conductive cylindrical screen 1104 and the electrode 1102, and (b) the combination of the non-conductive granular material 1122 and the conductive fluid prevents electrical arcing between the electrically conductive cylindrical screen 1104 and the electrode 1102 during an electric glow discharge. The non-conductive granular material 1122 can be marbles, ceramic beads, molecular sieve media, sand, limestone, activated carbon, zeolite, zirconium, alumina, rock salt, nut shells, wood chips or other suitable materials.

Figure 14:
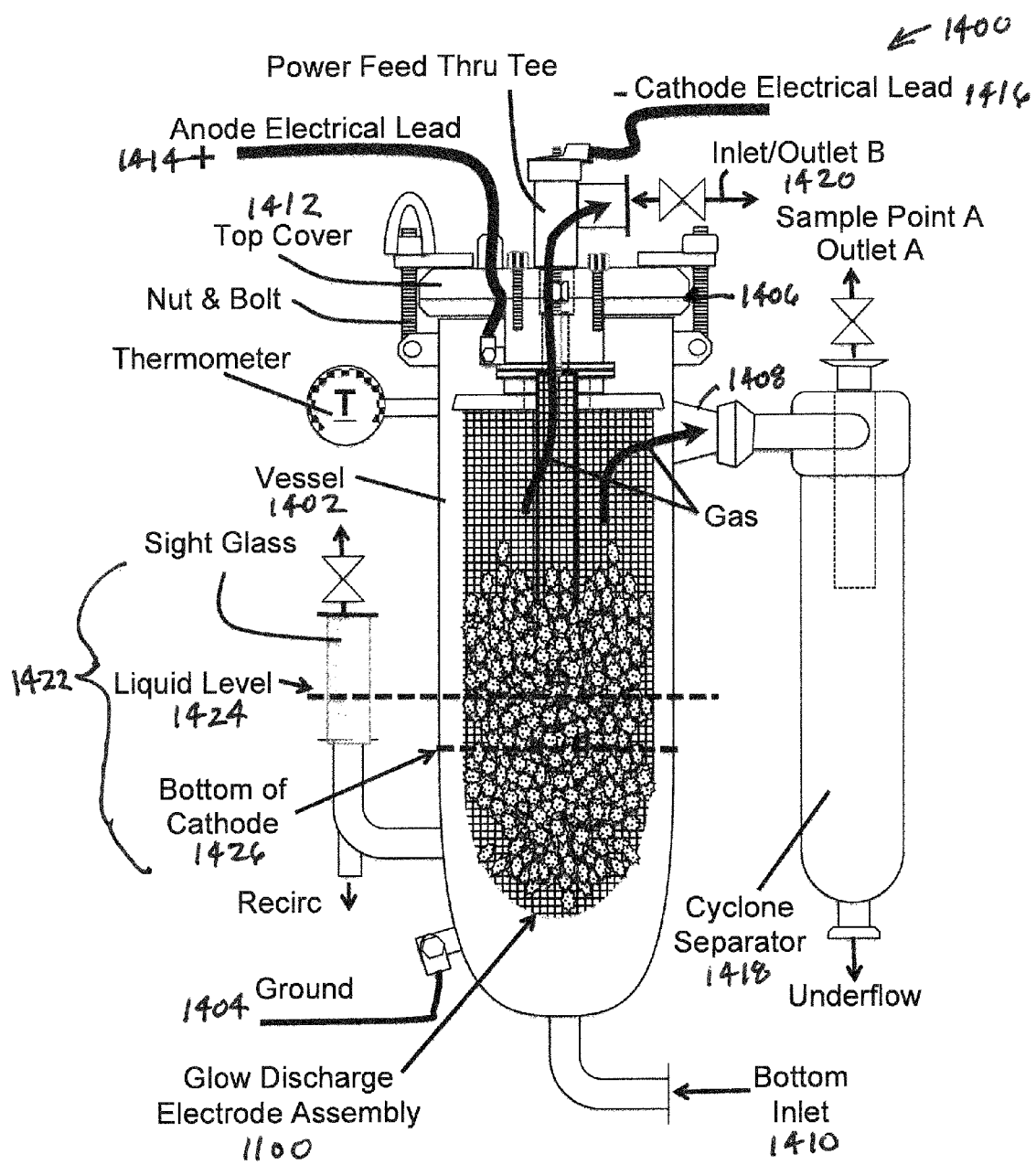
FIG. 14 is a cross-sectional view of a glow discharge electrode vessel in accordance with another embodiment of the present invention.

Turning to FIG. 14, a glow discharge vessel 1400 is shown wherein the Solid Oxide Glow Discharge Electrode Assembly 1100 was then inserted into a vessel 1402. It is preferable that the vessel 1402 is constructed of a non-conductive material such as a glass-lined vessel, plastic, concrete or ceramic. However, it will be understood that the vessel 1402 may also be constructed of an electrically conductive material such as metal, carbon, graphite or carbide. The vessel 1402 was grounded using ground 1404. The vessel 1402 was then charged with an electrolyte consisting of baking soda and water.

More specifically, the glow discharge vessel 1400 includes a vessel 1402, a top cover 1412 and a glow discharge electrode assembly 1100. The vessel 1402 has an open top 1406, an outlet 1408 disposed in an upper portion of the vessel 1402, and an inlet 1410 disposed in a lower portion of the vessel 1402. The top cover 1412 seals the open top 1406 of the vessel 1402, secures a glow discharge electrode assembly 1100 within the vessel 1402, and provides a first electrical connection 1414 and a second electrical connection 1416 to the glow discharge electrode assembly 1100. The glow discharge electrode assembly 1100 includes an electrically conductive cylindrical screen 1104, a flange assembly 1112, an electrode 1102, an insulator and a non-conductive granular material 1122. The electrically conductive cylindrical screen 1104 has an open end 1114 and a closed end 1116. The flange assembly 1112 is attached to and electrically connected to the open end 1114 of the electrically conductive cylindrical screen 1104. The flange assembly 1112 has a hole 1118 with a first diameter aligned with a longitudinal axis of the electrically conductive cylindrical screen 1104. The electrode 1102 is aligned with the longitudinal axis of the electrically conductive cylindrical screen 1104 and extends through the hole 1118 of the flange assembly 1112 into the electrically conductive cylindrical screen 1104. The electrode 1102 has a second diameter that is smaller than the first diameter of the hole 1118. The electrode 1102 can be an electrically conductive screen, electrically conductive tubing, an electrically conductive rod, or other suitable component. The insulator seals the hole 1118 of the flange assembly 1112 around the electrode 1102 and maintains a substantially equidistant gap 1120 between the electrically conductive cylindrical screen 1104 and the electrode 1102. The non-conductive granular material 1122 is disposed within the substantially equidistant gap 1120, wherein (a) the non-conductive granular material 1122 allows an electrically conductive fluid to flow between the electrically conductive cylindrical screen 1104 and the electrode 1102, and (b) the combination of the non-conductive granular material 1122 and the conductive fluid prevents electrical arcing between the electrically conductive cylindrical screen 1104 and the electrode 1102 during an electric glow discharge. The electric glow discharge is created whenever (a) the first electrical connection 1414 is connected to a DC electrical power supply such that the flange assembly 1112 and the electrically conductive cylindrical screen 1104 are an anode, (b) the second electrical connection 1416 is connected to the DC electrical power supply such that the electrode 1102 is a cathode, and (c) the electrically conductive fluid is introduced into the gap 1120 via the inlet 1410 of the vessel 1402. The cathode heats up during the electric glow discharge. The non-conductive granular material 1122 can be marbles, ceramic beads, molecular sieve media, sand, limestone, activated carbon, zeolite, zirconium, alumina, rock salt, nut shells, wood chips or other suitable materials.

The DC electrical power supply may operate in a range from 50 to 500 volts DC, or 200 to 400 volts DC. The cathode can reach a temperature of at least 500° C. or 1000° C. or 2000° C. during the electric glow discharge. The electrically conductive fluid can be water, produced water, wastewater, tailings pond water or other suitable fluid. The electrically conductive fluid can be created by adding an electrolyte to a fluid. The electrolyte can be baking soda, Nahcolite, lime, sodium chloride, ammonium sulfate, sodium sulfate, carbonic acid, or other suitable substance.

A cyclone separator 1418 can be connected to the outlet 1408 of the vessel 1402. In addition, an outlet 1420 can be disposed in the top cover 1412. Moreover, a fluid regulator 1422 can be attached to the vessel 1402 that maintains a specified level 1424 of the electrically conductive fluid within the vessel 1402, which is higher than the bottom of the cathode 1426.

As illustrated by the foregoing description, the present invention provides a method for producing a steam that includes the steps of providing a vessel 1402, one or more structural supports and one or more glow discharge assemblies. The vessel 1402 has an outlet disposed in a top of the vessel 1402, at least one inlet/outlet disposed in a side of the vessel 1402, and an inlet disposed in a lower portion of the vessel 1402. The one or more structural supports are disposed within the vessel 1402 to secure the two or more glow discharge assemblies within the vessel 1402, and provide a first electrical connection 1414 and a second electrical connection 1416 to each glow discharge electrode assembly 1100. Each glow discharge electrode assembly 1100 includes an electrically conductive cylindrical screen 1104, a flange assembly 1112, an electrode 1102, an insulator and a non-conductive granular material 1122. The electrically conductive cylindrical screen 1104 has an open end 1114 and a closed end 1116. The flange assembly 1112 is attached to and electrically connected to the open end 1114 of the electrically conductive cylindrical screen 1104. The flange assembly 1112 has a hole 1118 with a first diameter aligned with a longitudinal axis of the electrically conductive cylindrical screen 1104. The electrode 1102 is aligned with the longitudinal axis of the electrically conductive cylindrical screen 1104 and extends through the hole 1118 of the flange assembly 1112 into the electrically conductive cylindrical screen 1104. The electrode 1102 has a second diameter that is smaller than the first diameter of the hole 1118. The electrode 1102 can be an electrically conductive screen, electrically conductive tubing, an electrically conductive rod, or other suitable component. The insulator seals the hole 1118 of the flange assembly 1112 around the electrode 1102 and maintains a substantially equidistant gap 1120 between the electrically conductive cylindrical screen 1104 and the electrode 1102. The non-conductive granular material 1122 is disposed within the substantially equidistant gap 1120, wherein (a) the non-conductive granular material 1122 allows an electrically conductive fluid to flow between the electrically conductive cylindrical screen 1104 and the electrode 1102, and (b) the combination of the non-conductive granular material 1122 and the conductive fluid prevents electrical arcing between the electrically conductive cylindrical screen 1104 and the electrode 1102 during an electric glow discharge. The non-conductive granular material 1122 can be marbles, ceramic beads, molecular sieve media, sand, limestone, activated carbon, zeolite, zirconium, alumina, rock salt, nut shells, wood chips or other suitable materials. The electric glow discharge is created by: (1) connecting the first electrical connection 1414 to a DC electrical power supply such that the flange assembly 1112 and the electrically conductive cylindrical screen 1104 are an anode, (2) connecting the second electrical connection 1416 to the DC electrical power supply such that the electrode 1102 is a cathode, and (3) introducing the electrically conductive fluid into the gap 1120 via the inlet of the vessel 1402. The steam is produced using heat generated from the cathode during the electric glow discharge.

The following example will demonstrate the novelty and unexpected results produced from the system.

Example 7—Solid Oxide Glow Discharge Electrode Assembly Cell

An electrolytic solution of baking soda and water was mixed in a tank (not shown) and charged to the vessel with a pump. The electrolyte level was visibly controlled using a full port sight glass to ensure that the electrolyte covered both electrodes of the Glow Discharge Electrode Assembly. An ESAB ESP 150 Power Supply was connected to the Electrode Assembly via a (−) cathode electrical feed thru and an (+) anode electrical feed thru. The ESP 150 was turned on and the Glow Discharge Cell initially operated in an electrolysis mode by observation of the amp and volt meters on the ESP 150. As soon as the ESP 150 volt meter climbed to 370 volts, the system was then operating in a glow discharge mode. A pretest had been conducted in the mix tank using the electrode assembly only to visually observe the glow discharge. Returning back to the test, a vapor exited the vessel and flowed into a cyclone separator. The vapor was visibly observed exiting from the cyclone separator via a second full port sight glass (not shown). Next, samples were drawn from SAMPLE POINT A on separate days. The results are shown in the following table.

| Component | Percent (%) |
|---|---|
| Sample 1 | |
| $H_2$ | 44.70684743 |
| $O_2$ | 12.65419964 |
| $N_2$ | 9.108293403 |
| CO | 0.851646942 |
| $CO_2$ | 32.67901259 |
| Total | 100 |
| Sample 2 | |
| $H_2$ | 45.02220346 |
| $O_2$ | 12.19520642 |
| $N_2$ | 8.761431823 |
| CO | 0.825170549 |
| $CO_2$ | 33.19598774 |
| Total | 100 |
| Sample 3 | |
| $H_2$ | 35.14468696 |
| $O_2$ | 8.557908894 |
| $N_2$ | 42.46478656 |
| CO | 0.353547505 |
| $CO_2$ | 13.47907008 |
| Total | 100 |
| Sample 4 | |
| $H_2$ | 45.94646909 |
| $O_2$ | 9.282178602 |
| $N_2$ | 10.39980157 |
| CO | 0.856045147 |
| $CO_2$ | 33.51550559 |
| Total | 100 |

A mass balance was calculated to determine the percent water vapor vs. gases as shown in the above table. All tests showed that the mass flow of water vapor was 97% of the total mass flow of gases. Thus, it is now quite obvious that the glow discharge electrode assembly as disclosed in the present invention allows for the production of steam and non-condensible gases, particularly the largest part of the non-condensible gas being hydrogen. All of the gases were produced from an electrolyte consisting of baking soda and water. It is believed that the high nitrogen in Sample 3 was due to a leak in the vessel and sampling techniques used to purge the sampling bombs (vessels) with $N_2$.

Turning now to FIG. 15, a glow discharge system 1600 having multiple electrode assemblies 1100 (see FIGS. 11-14) housed within a single vessel 1602 is shown. This system reduces cost and complexity by using a multi-channel DC power supply, such as those manufactured by Emerson's Power Supply Division IE Power. One channel is used for each electrode assembly instead of installing and operating a separate power supply for each electrode assembly.

Hence, by utilizing multiple electrodes 1100 with a single power supply that has multiple channels this configuration opens the door for a unique and unobvious DC Glow Discharge Electrode Boiler that also generates hydrogen in addition to steam. Referring to FIGS. 4 and 15 collectively, multiple cathode tubes can be installed in a single vessel. This allows for the treatment of an electrolytic solution on the outside of the cathode tubes while heating water and producing steam in the inside of the cathode tubes. It will be understood that the discharge from the shell side can be flowed into the tube side to superheat the steam and hydrogen mixture. Conversely a vapor compressor may be used to pull a vacuum on the shell side while discharging the compressed vapor into the tube side. This vapor compression mode allows for a unique DC Glow Discharge Electrode Boiler for enhanced oil recovery ("EOR") as previously disclosed as well as treating frac flowback and produced water from oil and gas wells. In addition this system allows for superheating the steam and hydrogen mixture prior to entry into the ArcWhirl® Torch for steam reforming purposes.

The glow discharge system 1600 includes a vessel 1602, one or more structural supports 1604 and two or more glow discharge assemblies 1100. The vessel 1602 has an outlet 1606 disposed in a top of the vessel 1602, at least one inlet/outlet 1608 disposed in a side of the vessel 1602, and an inlet 1610 disposed in a lower portion of the vessel 1602. The one or more structural supports 1604 are disposed within the vessel 1602 to secure the two or more glow discharge assemblies 1100 within the vessel 1602, and provide a first electrical connection 1414 and a second electrical connection 1416 to each glow discharge electrode assembly 1100. Each glow discharge electrode assembly 1100 includes an electrically conductive cylindrical screen 1104, a flange assembly 1112, an electrode 1102, an insulator and a non-conductive granular material 1122. The electrically conductive cylindrical screen 1104 has an open end 1114 and a closed end 1116. The flange assembly 1112 is attached to and electrically connected to the open end 1114 of the electrically conductive cylindrical screen 1104. The flange assembly 1112 has a hole 1118 with a first diameter aligned with a longitudinal axis of the electrically conductive cylindrical screen 1104. The electrode 1102 is aligned with the longitudinal axis of the electrically conductive cylindrical screen 1104 and extends through the hole 1118 of the flange assembly 1112 into the electrically conductive cylindrical screen 1104. The electrode 1102 has a second diameter that is smaller than the first diameter of the hole 1118. The electrode 1102 can be an electrically conductive screen, electrically conductive tubing, an electrically conductive rod, or other suitable component. The insulator seals the hole 1118 of the flange assembly 1112 around the electrode 1102 and maintains a substantially equidistant gap 1120 between the electrically conductive cylindrical screen 1104 and the electrode 1102. The non-conductive granular material 1122 is disposed within the substantially equidistant gap 1120, wherein (a) the non-conductive granular material 1122 allows an electrically conductive fluid to flow between the electrically conductive cylindrical screen 1104 and the electrode 1102, and (b) the combination of the non-conductive granular material 1122 and the conductive fluid prevents electrical arcing between the electrically conductive cylindrical screen 1104 and the electrode 1102 during an electric glow discharge. The non-conductive granular material 1122 can be marbles, ceramic beads, molecular sieve media, sand, limestone, activated carbon, zeolite, zirconium, alumina, rock salt, nut shells, wood chips or other suitable materials. The electric glow discharge is created whenever (a) the first electrical connection 1414 is connected to a DC electrical power supply such that the flange assembly 1112 and the electrically conductive cylindrical screen 1104 are an anode, (b) the second electrical connection 1416 is connected to the DC electrical power supply such that the electrode 1102 is a cathode, and (c) the electrically conductive fluid is introduced into the gap 1120 via the inlet of the vessel 1602. The cathode heats up during the electric glow discharge.

Not being bound by theory it is believed that the additional hydrogen within the discharge from the Glow Discharge System of the present invention allows for enhanced steam reforming and treating of carbonaceous matter. The synergistic effects of coupling a Glow Discharge Cell to a Plasma Arc Torch is ideal for producing biochar and also is quite unique for activating and regenerating activated carbon. Thus, this allows for an onsite activated carbon regeneration system.

Of particularly interest for use of such a system is the US Coal Industry. Recent regulations by the US EPA will force coal burning power plants to reduce mercury emissions by March of 2014. Many coal burning power plants have begun injecting activated carbon to capture the mercury. Thus, this will leave a legacy of mercury contaminated carbon. A system as disclosed in the present invention can be utilized to make activated carbon, regenerate it and produce hydrogen for lean combustion.

Furthermore the foregoing tests have disclosed a system, method and apparatus for producing a syngas with a hydrogen to carbon ratio ranging from 1.5/1 to 4.0/1. Consequently, it is believed that the syngas produced form the current invention is suitable for conversion to a liquid via a gas to liquids process such as Fischer Tropsch Synthesis.

The foregoing description of the apparatus and methods of the invention in preferred and alternative embodiments and variations, and the foregoing examples of processes for which the invention may be beneficially used, are intended to be illustrative and not for purpose of limitation. The invention is susceptible to still further variations and alternative embodiments within the full scope of the invention, recited in the following claims.

What is claimed is:

1. A glow discharge assembly comprising:
   an electrically conductive cylindrical screen having an open end and a closed end;
   a flange assembly attached to and electrically connected to the open end of the electrically conductive cylindrical screen, the flange assembly having a hole with a first diameter aligned with a longitudinal axis of the electrically conductive cylindrical screen;
   an electrode aligned with the longitudinal axis of the electrically conductive cylindrical screen and extending through the hole of the flange assembly into the electrically conductive cylindrical screen, the electrode having a second diameter that is smaller than the first diameter of the hole;

an insulator that seals the hole of the flange assembly around the electrode and maintains a substantially equidistant gap between the electrically conductive cylindrical screen and the electrode; and a non-conductive granular material disposed within the substantially equidistant gap, wherein (a) the non-conductive granular material allows an electrically conductive fluid to flow between the electrically conductive cylindrical screen and the electrode, and (b) the combination of the non-conductive granular material and the conductive fluid prevents electrical arcing between the electrically conductive cylindrical screen and the electrode during an electric glow discharge.

2. The glow discharge assembly as recited in claim 1, wherein the electrode comprises an electrically conductive screen, electrically conductive tubing, or an electrically conductive rod.

3. The glow discharge assembly as recited in claim 1, wherein the non-conductive granular material comprises marbles, ceramic beads, molecular sieve media, sand, limestone, activated carbon, zeolite, zirconium, alumina, rock salt, nut shells or wood chips.

4. A glow discharge vessel comprising:
a vessel having an open top, an outlet disposed in an upper portion of the vessel, and an inlet disposed in a lower portion of the vessel;
a top cover that seals the open top of the vessel, secures a glow discharge assembly within the vessel, and provides a first electrical connection and a second electrical connection to the glow discharge assembly;
the glow discharge assembly comprising:
an electrically conductive cylindrical screen having an open end and a closed end,
a flange assembly attached to and electrically connected to the open end of the electrically conductive cylindrical screen, the flange assembly having a hole with a first diameter aligned with a longitudinal axis of the electrically conductive cylindrical screen,
an electrode aligned with the longitudinal axis of the electrically conductive cylindrical screen and extending through the hole of the flange assembly into the electrically conductive cylindrical screen, the electrode having a second diameter that is smaller than the first diameter of the hole,
an insulator that seals the first hole of the flange assembly around the electrode and maintains a substantially equidistant gap between the electrically conductive cylindrical screen and the electrode,
a non-conductive granular material disposed within the substantially equidistant gap, wherein (a) the non-conductive granular material allows an electrically conductive fluid to flow between the electrically conductive cylindrical screen and the electrode, and (b) the combination of the non-conductive granular material and the conductive fluid prevents electrical arcing between the electrically conductive cylindrical screen and the electrode during an electric glow discharge; and wherein: (1) the electric glow discharge is created whenever (a) the first electrical connection is connected to a DC electrical power supply such that the flange assembly and the electrically conductive cylindrical screen are an anode, (b) the second electrical connection is connected to the DC electrical power supply such that the electrode is a cathode, and (c) the electrically conductive fluid is introduced into the gap via the inlet of the vessel, and (2) the cathode heats up during the electric glow discharge.

5. The glow discharge vessel as recited in claim 4, wherein the electrode comprises an electrically conductive screen, electrically conductive tubing, or an electrically conductive rod.

6. The glow discharge assembly as recited in claim 4, wherein the non-conductive granular material comprises marbles, ceramic beads, molecular sieve media, sand, limestone, activated carbon, zeolite, zirconium, alumina, rock salt, nut shells or wood chips.

7. The glow discharge vessel as recited in claim 4, wherein the DC electrical power supply operates in a range from 50 to 500 volts DC.

8. The glow discharge vessel as recited in claim 4, wherein the DC electrical power supply operates in a range of 200 to 400 volts DC.

9. The glow discharge vessel as recited in claim 4, wherein the cathode reaches a temperature of at least 500° C. during the electric glow discharge.

10. The glow discharge vessel as recited in claim 4, wherein the cathode reaches a temperature of at least 1000° C. during the electric glow discharge.

11. The glow discharge vessel as recited in claim 4, wherein the cathode reaches a temperature of at least 2000° C. during the electric glow discharge.

12. The glow discharge vessel as recited in claim 4, wherein the electrically conductive fluid comprises water, produced water, wastewater or tailings pond water.

13. The glow discharge vessel as recited in claim 4, wherein:
the electrically conductive fluid is created by adding an electrolyte to a fluid; and
the electrolyte comprises baking soda, Nahcolite, lime, sodium chloride, ammonium sulfate, sodium sulfate or carbonic acid.

14. The glow discharge vessel as recited in claim 4, further comprising a cyclone separator connected to the outlet of the vessel.

15. The glow discharge vessel as recited in claim 4, further comprising an outlet disposed in the top cover.

16. The glow discharge vessel as recited in claim 4, further comprising a fluid regulator attached to the vessel that maintains a specified level of the electrically conductive fluid within the vessel.

17. The glow discharge vessel as recited in claim 4, wherein the glow discharge vessel produces steam and one or more gases.

18. The glow discharge vessel as recited in claim 17, wherein the one or more gases comprise at least 40% hydrogen.

19. A glow discharge system comprising:
a vessel having an outlet disposed in a top of the vessel, at least one inlet/outlet disposed in a side of the vessel, and an inlet disposed in a lower portion of the vessel;
one or more structural supports within the vessel that secure two or more glow discharge assemblies within the vessel, and provide a first electrical connection and a second electrical connection to each glow discharge assembly;
each glow discharge assembly comprising:
an electrically conductive cylindrical screen having an open end and a closed end,
a flange assembly attached to and electrically connected to the open end of the electrically conductive cylindrical screen, the flange assembly having a hole with a first diameter aligned with a longitudinal axis of the electrically conductive cylindrical screen, an electrode aligned with the longitudinal axis of the electrically conductive cylindrical screen and extending through the hole of the flange assembly into the electrically conductive cylindrical screen, the electrode having a second diameter that is smaller than the first diameter of the hole, an insulator that seals the first hole of the flange assembly around the electrode and maintains a substantially equidistant gap between the electrically conductive cylindrical screen and the electrode, a non-conductive granular material disposed within the substantially equidistant gap, wherein (a) the non-conductive granular material allows an electrically conductive fluid to flow between the electrically conductive cylindrical screen and the electrode, and (b) the combination of the non-conductive granular material and the conductive fluid prevents electrical arcing between the electrically conductive cylindrical screen and the electrode during an electric glow discharge; and wherein: (1) the electric glow discharge is created whenever (a) the first electrical connection is connected to a DC electrical power supply such that the flange assembly and the electrically conductive cylindrical screen are an anode, (b) the second electrical connection is connected to the DC electrical power supply such that the electrode is a cathode, and (c) the electrically conductive fluid is introduced into the gap via the inlet of the vessel, and (2) the cathode heats up during the electric glow discharge.

20. The glow discharge system as recited in claim 19, wherein the electrode comprises an electrically conductive screen, electrically conductive tubing, or an electrically conductive rod.

21. The glow discharge system as recited in claim 19, wherein the non-conductive granular material comprises marbles, ceramic beads, molecular sieve media, sand, limestone, activated carbon, zeolite, zirconium, alumina, rock salt, nut shells or wood chips.

22. The glow discharge system as recited in claim 19, wherein the DC electrical power supply operates in a range from 50 to 500 volts DC.

23. The glow discharge system as recited in claim 19, wherein the DC electrical power supply operates in a range of 200 to 400 volts DC.

24. The glow discharge system as recited in claim 19, wherein the cathode reaches a temperature of at least 500° C. during the electric glow discharge.

25. The glow discharge system as recited in claim 19, wherein the cathode reaches a temperature of at least 1000° C. during the electric glow discharge.

26. The glow discharge system as recited in claim 19, wherein the cathode reaches a temperature of at least 2000° C. during the electric glow discharge.

27. The glow discharge system as recited in claim 19, wherein the electrically conductive fluid comprises water, produced water, wastewater or tailings pond water.

28. The glow discharge system as recited in claim 19, wherein:
the electrically conductive fluid is created by adding an electrolyte to a fluid; and
the electrolyte comprises baking soda, Nahcolite, lime, sodium chloride, ammonium sulfate, sodium sulfate or carbonic acid.

29. The glow discharge system as recited in claim 19, further comprising a fluid regulator attached to the vessel that maintains a specified level of the electrically conductive fluid within the vessel.

30. The glow discharge system as recited in claim 19, wherein the glow discharge system produces steam and one or more gases.

31. The glow discharge vessel as recited in claim 30, wherein the one or more gases comprise at least 40% hydrogen.

* * * * *